(12) United States Patent
Rios et al.

(10) Patent No.: US 11,099,456 B2
(45) Date of Patent: Aug. 24, 2021

(54) PHOTONIC DEVICE

(71) Applicant: OXFORD UNIVERSITY INNOVATION LTD., Oxford (GB)

(72) Inventors: Carlos Rios, Oxford (GB); Harish Bhaskaran, Oxford (GB); Wolfram Pernice, Oxford (GB); Matthias Stegmaier, Oxford (GB)

(73) Assignee: OXFORD UNIVERSITY INNOVATION LTD., Oxford (GB)

( * ) Notice: Subject to any disclaimer, the term of this patent is extended or adjusted under 35 U.S.C. 154(b) by 0 days.

(21) Appl. No.: 16/549,842

(22) Filed: Aug. 23, 2019

(65) Prior Publication Data
US 2020/0081318 A1    Mar. 12, 2020

Related U.S. Application Data

(63) Continuation of application No. 15/760,945, filed as application No. PCT/GB2016/052871 on Sep. 15, 2016, now abandoned.

(30) Foreign Application Priority Data

Sep. 18, 2015 (GB) ..................................... 1516579
Apr. 27, 2016 (GB) ..................................... 1607344

(51) Int. Cl.
G02F 1/295 (2006.01)
G02F 1/313 (2006.01)
G02F 3/02 (2006.01)
G02F 1/01 (2006.01)
G11C 13/04 (2006.01)

(52) U.S. Cl.
CPC .............. *G02F 1/313* (2013.01); *G02F 1/0126* (2013.01); *G02F 3/02* (2013.01); *G11C 13/04* (2013.01)

(58) Field of Classification Search
CPC .......... G02F 1/313; G02F 1/0126; G02F 1/19; G02F 3/02; G11C 13/04
See application file for complete search history.

(56) References Cited

U.S. PATENT DOCUMENTS 7,016,589 B2    3/2006   Mendoza et al.
2006/0140535 A1  6/2006  Tsuda et al.
(Continued)

FOREIGN PATENT DOCUMENTS

CN    101866066 A    10/2010
EP    2957935 A1     12/2015

OTHER PUBLICATIONS

Johguchi K et al: "Reliable, low-power super-lattice phase-change memory without melting and write-pulse down slope", Reliability Physics Symposium (IRPS), 2013 IEEE International, IEEE, Apr. 14, 2013, (4 pages).

(Continued)

*Primary Examiner* — Ellen E Kim
(74) *Attorney, Agent, or Firm* — Procopio, Cory, Hargreaves & Savitch LLP

(57) ABSTRACT

A photonic device (100) comprising: an optical waveguide (101), and a modulating element (102) that is evanescently coupled to the waveguide (101); wherein the modulating element (102) modifies a transmission, reflection or absorption characteristic of the waveguide (101) dependant on its state, and the state of the modulating element (102) is switchable by an optical switching signal (125) carried by the waveguide (101), or by an electrical signal that heats the modulating element (102).

18 Claims, 13 Drawing Sheets

(56) References Cited

U.S. PATENT DOCUMENTS

| | | | |
|---|---|---|---|
| 2009/0180728 A1* | 7/2009 | Meijer | G02F 1/19 |
| | | | 385/9 |
| 2012/0163749 A1* | 6/2012 | Huang | G02F 1/225 |
| | | | 385/3 |
| 2015/0168803 A1 | 6/2015 | Xu et al. | |
| 2015/0277053 A1* | 10/2015 | Zheng | H04J 14/00 |
| | | | 385/31 |
| 2018/0043448 A1 | 2/2018 | Tominaga et al. | |
| 2019/0253776 A1* | 8/2019 | Mazed | G02F 2/004 |

OTHER PUBLICATIONS

Markov, Petr et al. "Hybrid Si-V0_2-Au optical modulator based on near-field plasmonic coupling", Optics Express, vol. 23, No. 5, Mar. 5, 2015, p. 6878-6887, (10 pages).

Pernice, Wolfram H.P. et al. "Photonic non-volatile memories using phase change materials", Applied Physics Letters, A I P Publishing LLC, US, vol. 101, No. 17, Oct. 22, 2012, pp. 171101-171104, (4 pages).

Rios, Carlos et al: "On-Chip Photonic Memory Elements Employing Phase-Change Materials", Advanced Materials, vol. 26, No. 9, Dec. 2, 2013, pp. 1372-1377, (6 pages).

Tanaka, Daiki et al. "Ultra-small, self-holding, optical gate switch using Ge2Sb2Te5 with a multi-mode Si waveguide" Optics Express 10283, vol. 20, No. 9, Apr. 23, 2012, pp. 10289-10294, (12 pages).

International Search Report and Written Opinion of the International Searching Authority for PCT/GB2016/052871 dated Nov. 28, 2016, (13 pages).

Wikipedia, Band Gap, https://en.wikipedia.org/wiki/Band_gap.

* cited by examiner

PHOTONIC DEVICE

This application is a Continuation of U.S. application Ser. No. 15/760,945 filed Mar. 16, 2018, which in turn is a national stage filing under 35 U.S.C. 371 of PCT/GB2016/052871 filed Sep. 15, 2016, the disclosures of which are incorporated by reference in their entirety herein.

The invention relates to a switchable photonic device, and to a memory element, and an optical switch.

The advent of photonic technologies, in particular in the area of optical signalling, coupled with advances made in fabrication capabilities has created a growing need for practical photonic memories. Such memories are essential to supercharge computational performance in serial computers by speeding up the von-Neumann bottleneck, i.e. the information traffic jam between the processor and the memory. This bottleneck limits the speed of almost all processors today; it has already led to the introduction of multicore processor architectures and drives the search for viable on-chip optical interconnects. However, shuttling information optically from the processor to electronic memories is presently not efficient because electrical signals have to be converted to optical ones and vice-versa. Information transfer and storage exclusively by optical means is highly desirable because of the inherently large bandwidth, low residual cross-talk and high speed of optical information transfer. On a chip it has been challenging to achieve because practical photonic memories may need to retain information for long periods of time and achieve full-integration with the ancillary electronic circuitry, thus requiring compatibility with semiconductor processing.

A further performance limitation may occur between the rapid access volatile memory (e.g. DRAM) associated with the processor, and the longer term, non-volatile memory of a storage device (e.g. NAND based memory of a solid state device, or magnetic domain based storage of a hard disk). Storage class memory has been proposed as an intermediate class of memory that is both non-volatile, and with faster reading than existing storage devices.

Optical gate switches have been fabricated using $Ge_2Sb_2Te_5$ (GST), for example Tanaka, Daiki, et al. "Ultra-small, self-holding, optical gate switch using $Ge_2Sb_2Te_5$ with a multi-mode Si waveguide." *Optics express* 20.9 (2012): 10283-10294. This device uses an external, free-space optical light path to provide an optical switching signal to the GST element to change the state of the switch. This requires precision alignment of bulk free-space optical elements to the GST element, and is impractical for controlling multiple GST elements, especially where the elements are densely packed (e.g. in an array), which may be useful in a practical memory module. It is also difficult to address a small GST element in this way (due to diffraction limits).

It is desirable to address at least some of the above mentioned problems.

According to a first aspect of the invention, there is provided a photonic device comprising: an optical waveguide, and a modulating element that is evanescently coupled to the waveguide; wherein the modulating element modifies a transmission, reflection or absorption characteristic of the waveguide dependant on its state, and the state of the modulating element is switchable by an optical switching signal carried by the waveguide.

The term optical as used herein relates to electromagnetic wavelengths of between 100 nm and 2500 nm.

According to another aspect, there is provided a device comprising: a waveguide; and a modulating element that is evanescently coupled to the waveguide; wherein the modulating element modifies a transmission, reflection or absorption characteristic of the waveguide dependant on its state, and the state of the modulating element is switchable by a switching signal carried by the waveguide.

The modulating element may comprise a phase change material.

The modulating element may comprise a phase change superlattice material.

The modulating element may comprise a material with a refractive index that is switchable between at least two stable values.

The modulating element may comprise a plurality of stable solid states, each corresponding with a different transmission, reflection or absorption characteristic of the waveguide.

A reflection characteristic of the waveguide may be modified by switching the state of the modulating element.

The modulating element may comprise a material comprising a compound or alloy of a combination of elements selected from the following list of combinations: GeSbTe, $VO_x$, $NbO_x$, GeTe, GeSb, GaSb, AgInSbTe, InSb, InSbTe, InSe, SbTe, TeGeSbS, AgSbSe, SbSe, GeSbMnSn, AgSbTe. AuSbTe, and AlSb.

The material may comprise a mixture of compounds of alloys or combinations of elements from the list.

A core material of the waveguide may comprise an insulator.

A core material of the waveguide may have an optical bandgap of at least 1, 1.5, 2, 2.5 or 3 eV.

A core material of the waveguide may comprise a material selected from: silicon, silicon nitride, gallium nitride, gallium arsenide, magnesium oxide, and diamond (single crystal or polycrystalline).

The modulating element may comprise a material having more than two states, between which the material is switchable, each state associated with a different transmission, reflection or absorption characteristic of the waveguide.

The modulating material may have a thickness of less than 40 nm or 20 nm.

The waveguide may comprises an optical structure configured to enhance interaction of the switching signal with the modulating element.

The optical structure may comprise at least one of: a photonic crystal, a cavity in a core of the waveguide, an antenna and a plasmonic antenna.

The waveguide may comprise an optical resonator, the modulating element being evanescently coupled to the optical resonator.

The waveguide may comprise a plurality of optical resonators, each having a different resonant frequency, the device comprising a modulating element evanescently coupled to each optical resonator, wherein the transmission, reflection or absorption properties of the waveguide at each of a plurality of wavelengths is independently modified depending on the state of the respective modulating element coupled to the resonator corresponding with the respective wavelength, the state of each modulating element being switchable by an optical switching signal carried by the waveguide.

The waveguide may be a coupling waveguide, and further comprising a first and second waveguide, the coupling waveguide optically coupling the first waveguide to the second waveguide, the degree of coupling depending on the state of the modulating element.

The optical resonator may comprise a ring resonator, disk resonator, race-track resonator, wheel resonator.

The device may comprise an optical cavity, and the modulating element may be used to tune a resonant frequency of the optical cavity. The transmission, reflection or absorption characteristic may comprise a resonant frequency or a transmission, reflection or absorption spectrum.

According to a second aspect, there is provided a photonic latch, comprising a device according to the first aspect, wherein the first waveguide comprises an input port, for receiving an input signal, the second waveguide comprises an output port, and the coupling waveguide comprises a control port for receiving the switching signal, wherein the degree of optical coupling between the input port and output port is varied by switching the modulating element via the control port.

According to a third aspect of the invention, there is provided a photonic device comprising: an optical waveguide, and a modulating element that is evanescently coupled to the waveguide; wherein the modulating element modifies a transmission, reflection or absorption characteristic of the waveguide dependant on its state, and the device comprises an electrical conductor configured to switch the state of the modulating element using an electrical signal that heats the modulating element.

The electrical conductor may comprise a first electrode in contact with the modulating element, and a second electrode in contact with the modulating element, so that a conducting path is defined through the modulating element between the first and second electrode. The state of the modulating element may thereby be switchable by passing the electrical signal through the conducting path.

The modulating element may comprise a layer of material. The modulating element may be sandwiched between the first and second electrode, so that the conducting path is substantially normal to a plane of the modulating element. The first and second electrode may alternatively be arranged to define a lateral conducting path substantially parallel to a plane of the modulating element.

At least one of the first and second electrode may comprise a substantially transparent material (e.g. at the wavelength of an optical switching signal), such as indium tin-oxide (ITO).

The device may comprise a resistor (e.g. a conducting track) in thermal contact with the modulating element, so that the modulating element is switchable by passing the electrical signal through the resistor (with the electrical signal not passing through the modulating element).

The resistor may comprise a metal or semiconductor element.

According to an fourth aspect of the invention, there is provided a photonic device comprising: a conducting path, an optical waveguide, and a modulating element that is evanescently coupled to the waveguide and which forms part of the conducting path; wherein the modulating element modifies the resistance of the conducting path depending on its state, and the state of the modulating element is switchable by an optical switching signal carried by the waveguide.

The device may comprise a first electrode in contact with the modulating element, and a second electrode in contact with the modulating element, so that the conducting path is defined through the modulating element between the first and second electrode. The state of the modulating element may thereby be determined by the resistance of the conducting path.

According to a fifth aspect, there is provided a Mach-Zehnder interferometer that splits an input signal received at an input port between a first and second optical path, and then recombines the input signal after it has passed through the first and second optical path, wherein at least one of the first and second path comprise a device according to the first aspect or third aspect and the transmission, reflection or absorption property is an optical path length.

According to a sixth aspect, there is provided a tunable grating comprising a device according to the first aspect or third aspect, wherein the grating is defined by a plurality of modulating elements disposed side-by-side on the waveguide.

The grating may be a Bragg grating.

The waveguide may be a planar waveguide, and the grating may be configured to define an out-of-plane coupler that couples light between the waveguide and free space in a direction at an angle to the plane of the waveguide, wherein the transmission, reflection or absorption property is resonant frequency of the coupler.

According to a seventh aspect, there is provided a tuneable optical filter comprising a device according to the first aspect or third aspect.

According to a eighth aspect, there is provided an optical switch comprising a device according to the first aspect or third aspect.

According to a ninth aspect, there is provided a switching fabric comprising: a plurality of horizontal waveguides, and a plurality of vertical waveguides, and a device according to the first aspect or third aspect optically coupling each horizontal waveguide to each vertical waveguide at each respective intersection therebetween.

According to a tenth aspect, there is provided an optical system, comprising:
- a device according to the first aspect,
- a light source coupled to the waveguide for providing the switching signal; and
- a controller operable to modify the transmission, reflection or absorption characteristic of the waveguide by operating the light source to produce the switching signal.

The system may further comprise a light detector coupled to the waveguide and configured to determine the transmission, reflection or absorption characteristic by detecting a probe signal from the waveguide.

The controller may be configured to use the light source to provide the probe signal and the switching signal.

A further light source may be provided coupled to the waveguide for providing the probe signal; wherein the controller is configured to use the further light source to provide the probe signal.

The light source and the further light source may both be monochromatic, and have different wavelengths. The light source and further light source may be coherent, or incoherent.

According to another aspect, there is provided an optical system, comprising:
- a device according to the third aspect,
- an electrical controller coupled to the conducting path for providing an electrical switching signal to the conducting path;
- a light source coupled to the waveguide for reading the state of the modulating element, based on the transmission, reflection or absorption characteristic of the waveguide.

According to another aspect, there is provided an optical system, comprising:
- a device according to the fourth aspect,
- a light source coupled to the waveguide for providing the switching signal; and an electrical controller coupled to the conducting path for reading the state of the modulating element.

According to an eleventh aspect, there is provided a memory cell, comprising a device according to the first, third or fourth aspect.

According to a twelfth aspect, there is provided an optical memory module, comprising a plurality of memory cells according to the eleventh aspect.

According to a thirteenth aspect, there is provided a computer comprising a processor and a memory module according to the twelfth aspect.

According to an fourteenth aspect, there is provided a method of varying the transmission, reflection or absorption properties of a device comprising an optical waveguide, comprising changing a state of a modulating element that is evanescently coupled to the waveguide using an optical switching signal carried by the waveguide.

The device may be according to the first aspect or the fourth aspect.

The modulating element may comprise a phase change material, and changing the state of the modulating element may comprise changing the degree to which the phase change material is amorphous or crystalline.

The modulating element may comprise more than two stable solid states, each state corresponding with a different transmission, reflection or absorption characteristic of the waveguide, wherein the method comprises switching the modulating element between at least two different states using a plurality of optical switching signals carried by the waveguide, The device may comprise a plurality of modulating elements coupled to the waveguide, and the method may comprise independently addressing each modulating element using a switching signal having a wavelength corresponding with the respective modulating element.

Each feature (or features) of each aspect may be combined with each feature (or features) of any other aspect.

Each and every embodiment and feature disclosed in the priority documents is optionally disclaimed from the scope of the present disclosure.

These and other aspects of the invention will be apparent from, and elucidated with reference to, the embodiments described hereinafter.

Embodiments will be described, by way of example only, with reference to the accompanying drawings, in which.

Figure 27:
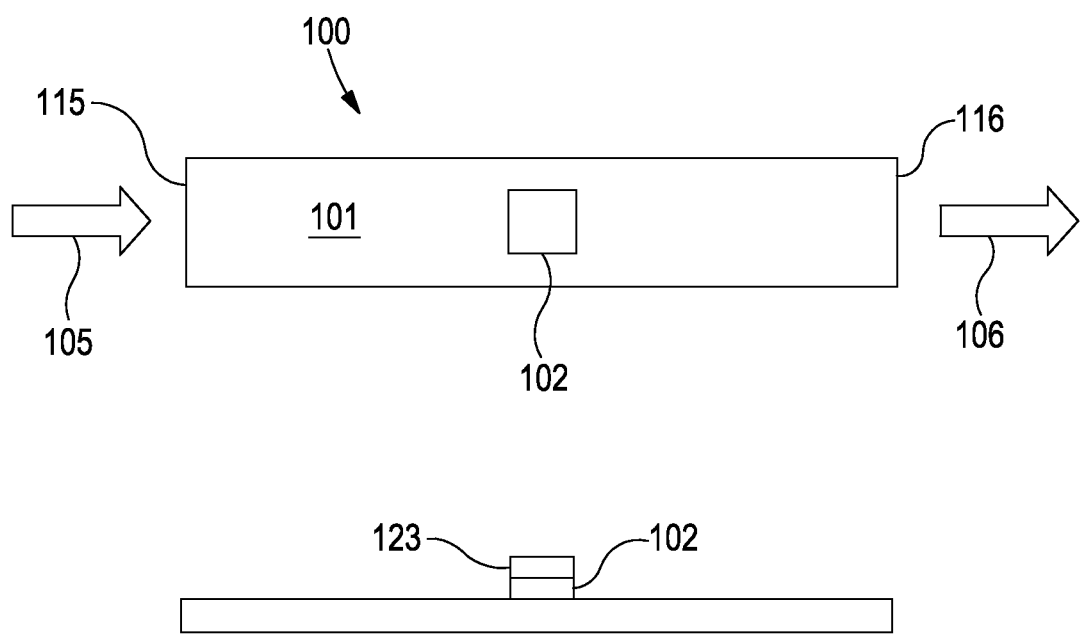
Figure 28:
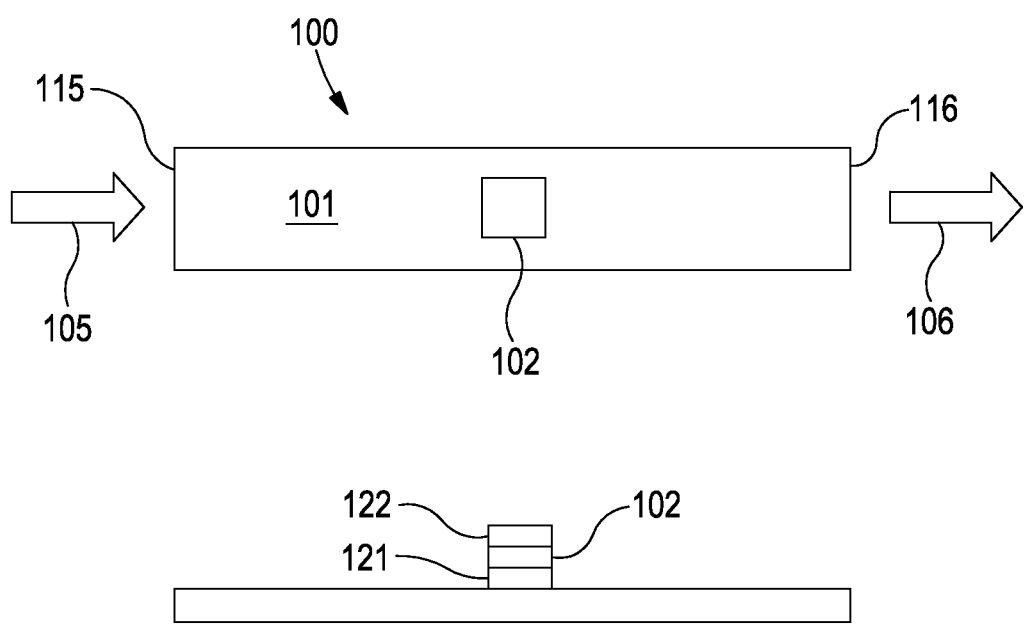

FIG. 27 is a schematic view of a device according to an embodiment in which the state of the modulating element can be changed by passing an electrical current through the modulating element; and FIG. 28 is a schematic view of a device according to an alternative embodiment in which the state of the modulating element can be changed by passing an electrical current through a resistive element in thermal contact with the modulating element.

A candidate technology for all-optical memories is to use phase-change materials (PCMs), which are already the subject of intense research and development over the last decade, in the context of electronic memories. A striking and functional feature of these materials is the high contrast between the crystalline and amorphous phase of both their electrical and optical properties. In particular, PCMs (e.g. chalcogenide-based PCMs) have the ability to switch between these two states in response to appropriate heat stimuli (crystallization) or melt-quenching processes (amorphization). These PCMs (which include tellurides and antimonides) can be switched on a sub-nanosecond timescale with high reproducibility which enables ultra-fast operation over switching cycles up to $10^{12}$ times using current-generation materials. New and improved PCM materials, such as the so-called phase-change super-lattice materials, are expected to deliver even better performance in the future. In addition, at normal operating temperatures (e.g. NIST standard temperature and pressure conditions) the states may be stable for years, which may be appropriate for non-volatile memory.

Many PCMs show significant change in refractive index in the visible and even larger changes in the near-infrared wavelength regime, which is typically the spectral region of choice for telecommunication applications. According to embodiments, PCMs are embedded in photonic circuits, to provide fast and repeatable all-optical, multi-level, multi-bit, non-volatile memory. Wavelength division multiplexed (WDM) access can be achieved on a chip comprising at telecommunications wavelengths compatible with on-chip optical interconnects. In contrast to prior art free-space optical implementations where PCM cells are switched with a focused laser in the far-field, devices according to embodiments are operated in the optical near-field (by evanescent coupling).

Waveguide integrated modulating elements are not restricted in size by the diffraction limit of the input light and can hence be miniaturized to nanoscale dimensions. In the detailed exemplary embodiments described below, the well-studied alloy $Ge_2Sb_2Te_5$ (GST) is used because of its proven data retention capabilities and high state discrimination down to nanoscale cell sizes, which enables dense packaging and low-power memory switching.

In embodiments, data may be stored in a modulating element comprising a PCM material. The modulating element may be placed directly on top of a nanophotonic waveguide core. This is a convenient way of coupling the waveguide to the modulating element in the nearfield. Both changing the state (writing/erasing) of the modulating element, and read-out of the current state of the modulating element is carried out via evanescent coupling between the waveguide and the modulating element and is thus not subject to the diffraction limit. The writing and readout of the modulating element is done directly within the waveguide, and may use nanosecond optical pulses. Embodiments therefore provide a promising route towards fast all-optical data storage in photonic circuits.

Figure 1:
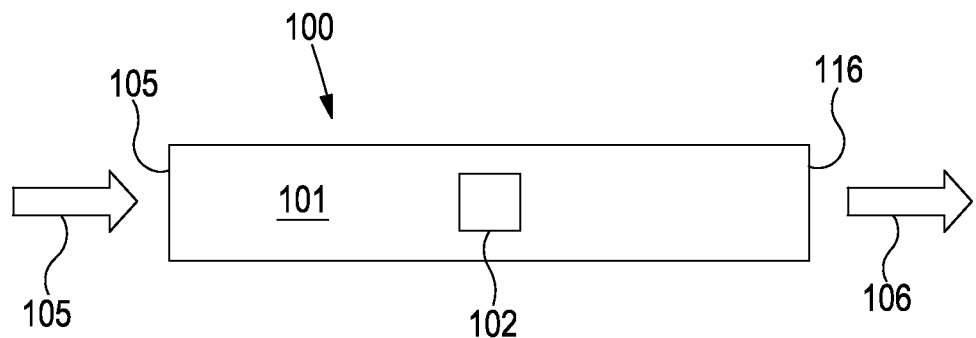
FIG. 1 is a schematic plan view of a device according to an embodiment.

FIG. 1 shows a device 100 according to an embodiment, comprising a waveguide 101 and a modulating element 102. The modulating element 102 is evanescently (near field) coupled to the waveguide 101, so that a light signal carried by the waveguide 101 interacts with the modulating element 102.

The modulating element 102 may comprise any material that is switchable between different states, each different state corresponding with different optical properties of the modulating element. Preferably, the modulating element 102 comprises a phase change material such as GST. The modulating element 102 may comprise a further encapsulation layer, which may comprise ITO, for example to protect the PCM layer from oxidation.

The waveguide 101 may be, but is not limited to, a planar waveguide, for example a rib waveguide. The waveguide 101 comprises a core material that is capable of carrying an optical switching signal 125 to the modulating element 102 so as to switch the state of the modulating element 102. In general, suitable materials for the waveguide core may have a bandgap of at least 1 eV. One example of a suitable material for the core of the waveguide 101 is silicon nitride. Alternative materials include silicon, gallium nitride, gallium arsenide, diamond (monocrystalline or polycrystalline) and magnesium oxide, but any material with a bandgap greater than 1 eV may be suitable. The waveguide core may comprise an insulating material or a semiconductor.

An air cladding may be used around the waveguide core 101. In alternative embodiments, other materials may be used. Solid phase cladding materials may be used to reduce a thermal time constant of the modulating element 102.

The waveguide 101 comprises a first port 115 and a second port 116. The transmission characteristics of the optical waveguide 101 may be inferred by applying a probe signal 105 at the first port 115, and monitoring the resulting output probe signal 106 at the second port 116. The probe signal 105 may be a pulsed signal or a continuous wave signal.

The state of the modulating element 102 is switchable by an optical switching signal 125 carried by the waveguide 101. An optical switching signal 125 may be input to the waveguide at either of the first or second port 115, 116. The switching signal 125 may have a higher power than the probe signal 105. The evanescent coupling of the optical switching signal 125 may result in the absorption of optical power by the modulating element 102. The consequent heating of the modulating element 102 by the optical switching signal 125 may change the state of the modulating element 102. Since the modulating element 102 is optically coupled to the waveguide 101, changes to the optical properties of the modulating element 102 result in changes to the transmission, reflection or absorption characteristics of the optical waveguide 101. The state of the modulating element 102 may be used to encode information.

Figure 2:
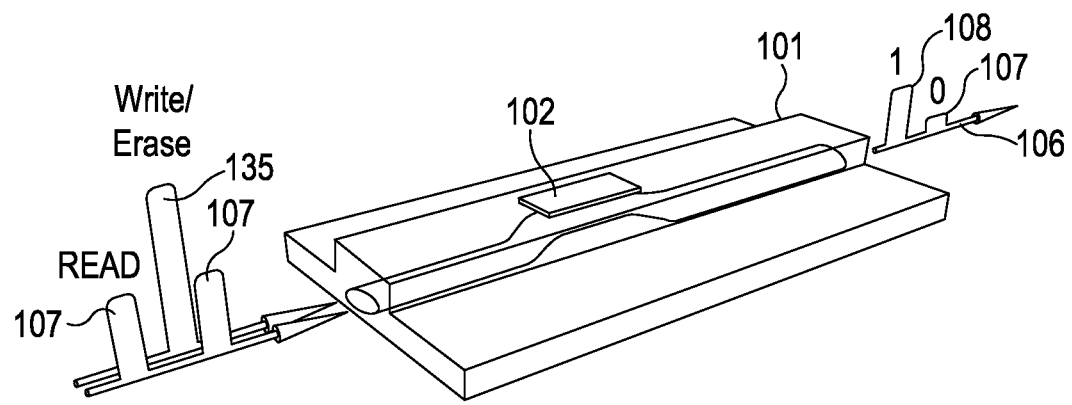
FIG. 2 is a rendering illustrating the operation of a device according to an embodiment.

FIG. 2 illustrates the operation of a device 100 according to an embodiment. A probe signal 105 applied to a first port 115 may be used to monitor a transmission characteristic of the waveguide 101 by monitoring the output probe signal 106 at the second port 116.

Figure 3:
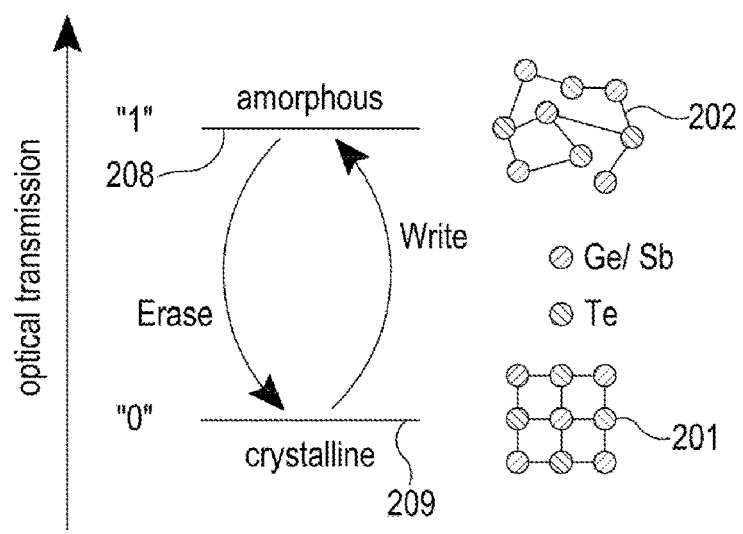
FIG. 3 illustrates the transition between states of an example phase change material.
Figure 4:
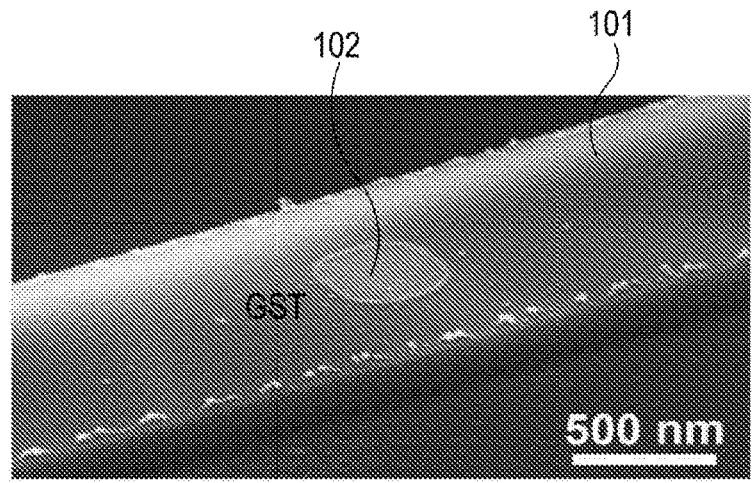
FIG. 4 is a scanning electron micrograph of a device according to an embodiment.
Figure 5:
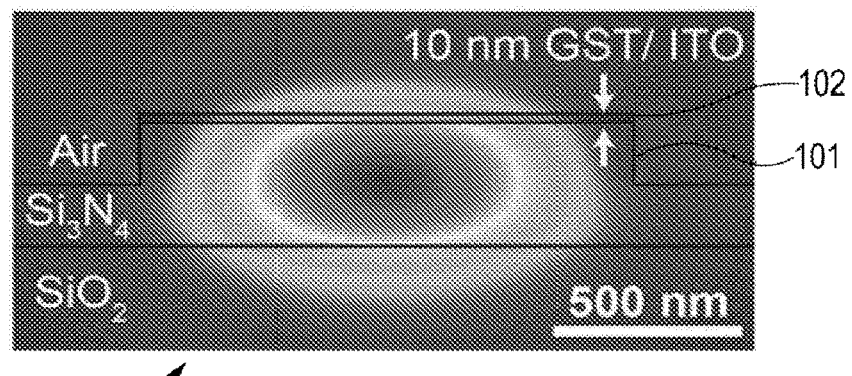
FIG. 5 is a simulation of a TE optical mode in a device according to an embodiment.

As illustrated in FIG. 3, the crystalline state 201 (which may be assigned as Level 0, 208) exhibits higher optical attenuation and thus less optical transmission than the amorphous state (which may be assigned Level 1, 209). Therefore, stored data may be encoded in the amount of light 106 transmitted through (along) the waveguide 101 (i.e. exiting the second port 116 of the waveguide) and can be read-out with a low-power probe signal 105, which may comprise a series of optical pulses 107. The state (e.g. degree of amorphisation/crystallinity) of the modulating element 102 influences the optical properties of the waveguide 101 and therefore the waveguide mode profile, as illustrated for the simulated transverse-electric (TE) mode 501 in FIG. 5.

In the crystalline state 201, the PCM may be more absorptive, thus pulling the light towards the modulating element 102, resulting in stronger attenuation of the passing optical signal. In the amorphous phase 202, on the other hand, the absorption is reduced and therefore the modulating element 102 does not attenuate the waveguide transmission to the same degree.

Changing the state of the modulating element 102 may be achieved by inducing a phase-transition (or partial phase-transition) with an optical switching signal 125, which may comprise a more intense light pulse 135 than the probe pulses 107 of the probe signal 105. If the energy absorbed by the modulating element 102 is sufficient to heat it up to a transition temperature of the PCM, these pulses 135 can initiate either amorphization or crystallization. Referring to FIG. 3, a transition 211 from a crystalline state 209 to an amorphous state 208 may be thought of as a write step, and a transition 210 from an amorphous state 208 to a crystalline state 209 may be thought of as an erase step.

For amorphization, the PCM (e.g. GST) may be melted and then cooled down rapidly to preserve this disordered state. On the other hand, heating the PCM above the crystallization temperature (but below the melting temperature) for a few nanoseconds may enable recovery of the atomic ordering and thus crystallization. Transmission properties of the waveguide 101 may therefore be modulated by varying the absorptive state of the modulating element 102. This is different from the phenomenon employed in conventional optical storage (where reflectivity is instead modulated).

In an embodiment, an all photonic nonvolatile memory element is provided. Multiple modulating elements may be addressed using wavelength multiplexing, which may be applied to deliver multi-bit memory access. Multiple levels of information (i.e. multiple bits) may be encoded in a single modulating element 102 by using more than two states to encode information. A single shot read and write switching signal may be used to transition the modulating element between any of the more than two states.

Although a PCM with multiple stable states is particularly appropriate for non-volatile memory applications, in alternative embodiments different materials may be used that do not comprise states that are stable (e.g. at NIST STP). In some embodiments the state of the modulating element 102 may be volatile, and a controller may be provided to periodically refresh the state of the modulating so as to maintain desired state thereof (e.g. maintain information encoded by the state). In other embodiments, the device may be temperature controlled (e.g. cooled), so that the PCM is stable, rather than operating at typical room temperatures.

The waveguide 101 may be fabricated from 335 nm $Si_3N_4$/3350 nm $SiO_2$ wafers using lithography. A soft reflow process may be employed to reduce intrinsic surface roughness of the photosensitive resist following exposure. Subsequently, reactive ion etching (RIE) may be used (e.g. in $CHF_3/O_2$) to pattern the $Si_3N_4$ followed by the complete removal of the remaining resist under $O_2$ plasma. The depth of the etch (and of the starting layers) may be selected depending on the design of the device. In the present examples, an etch depth of 165 nm was used, except for the ring devices, where an etch depth of 330 nm was used. Example devices for which results are described herein are designed with a waveguide width of 1.3 μm or 0.9 μm (for ring devices).

The modulating elements 102 for which results are shown herein are fabricated by depositing GST and indium tin oxide (ITO) in a lift-off process. For this, a second lithography step is carried out using positive tone PMMA resist at 8% concentration. Openings on top of the waveguides are defined, aligned to the previously written waveguide structures. Subsequently a 10 nm layer of GST is sputtered and capped with 10 nm of ITO to avoid oxidation. Finally, lift-off of the GST/ITO layers is done in hot acetone supported by soft sonication.

The features and steps of this fabrication process flow are merely exemplary, and embodiments may be fabricated in other ways.

The device 100 may be operated by using an optical switching signal 125 and an optical probe signal 105. Both writing and erasing of the modulating element 102 may be performed with nanosecond light pulses that are generated off-chip. This is convenient in an experimental context, but it is also envisaged that a suitable light source may be included on-chip. An electro-optical modulator (EOM) may be used to modulate the optical switching signal 125. The optical switching signal 125 may be coupled into the on-chip waveguides, for example using grating couplers. The device 100 may be tuned for operation in the optical telecommunications C and L band.

The read-out of the state of the modulating element 102 may be performed using a probe signal 105 having readout pulses (e.g. of 500 ps duration, generated with the EOM) or with a continuous wave (CW) probe signal 105. In both cases, the probe signal 105 may have at least one order of magnitude less power than the switching signal 125. The probe signal 105 may be spectrally separated from the switching signal 125. A colour selective filter may be used to separate the probe signal 105 from the switching signal 125. Further suppression of the switching signal 125 may be achieved by counter-propagation of the probe signal 105 and the switching signal 125 through the waveguide 101.

This counter propagation of the probe and switching signal may be implemented with a set of two optical circulators (not shown) which direct light coming from a laser source onto the device 100 and subsequently onto the photodetectors. An optical band-pass filter may be used to suppress the influence of back-reflections. The filter may have a 1 dB insertion loss, a 3 dB bandwidth of 2 nm and an off-resonance suppression exceeding 40 dB for wavelengths further apart than 10 nm.

The switching signal 125 may be generated from a continuous wave (CW) diode laser in combination with an electro-optical modulator, controlled by an electrical pulse generator. Switching signal pulses 135 may be further amplified in power by a low-noise erbium-doped fiber amplifier (EDFA). Such an implementation may provide accurate control over both pulse length and power, enabling pulses as short as 300 ps, with pulse edges in the picosecond-regime and with peak powers up to 150 mW.

The probe signal 105 may comprise CW-light from a second laser source. After propagation through the device 100 and the band-pass filter, the light may be is split into two beams which are respectively detected by a fast photodetector and a low-noise photodetector. The signal of the fast detector enables recording a high-resolution time-trace of the response with a 6 GHz oscilloscope while the overall device transmission may be monitored at all times with the low-noise detector.

Crystallization of amorphous PCM may enhance optical absorption in the modulating element 102 at telecommunication wavelengths, for instance by one order of magnitude.

This increase in optical absorption results in an increase in the proportion of the energy of a switching signal 125 in the waveguide 101 that is absorbed by the modulating element 102. This renders both amorphization and crystallization transitions possible with optical switch signal pulses 135 of comparable length and power. Full recrystallization with a single light pulse 135 may require optimisation of the pulse (e.g. duration and power).

If the phase transition occurs before the end of the pulse 135, the continued optical energy supply may heat up the PCM further, to the melting temperature, and cause immediate reamorphization. Temperature variations across the memory cell may mean that this cannot be prevented completely since all parts of the PCM material may not crystallize simultaneously. To address this issue, an erase transition 210 (making the PCM material more crystalline) may be based on stepwise partial recrystallization using a train of consecutive pulses 135. In order to prevent reamorphization of already crystallized regions, the individual pulse energies may be gradually decreased from pulse to pulse (e.g. by approximately 5% of the initial pulse energy). The initial pulse energy may correspond with the pulse energy used for a write transition 211. The energy of the final pulse determines which state is achieved, and therefore what transmission characteristic of the waveguide 101 is achieved. The final state can be fully crystalline or an intermediate state (i.e. partially amorphous and partially crystalline), for instance by stopping the erase transition 210 at the same energy required for a write transition 211 to that specific level.

High reproducibility of the transition operations may be achieved by an initial conditioning step. A conditioning step may comprise performing a write/erase switching cycle a few times on the as-deposited and subsequently annealed GST. Within the first few cycles the read-out transmissions, which initially vary slightly from cycle to cycle, stabilize to a fixed value.

Figure 6:
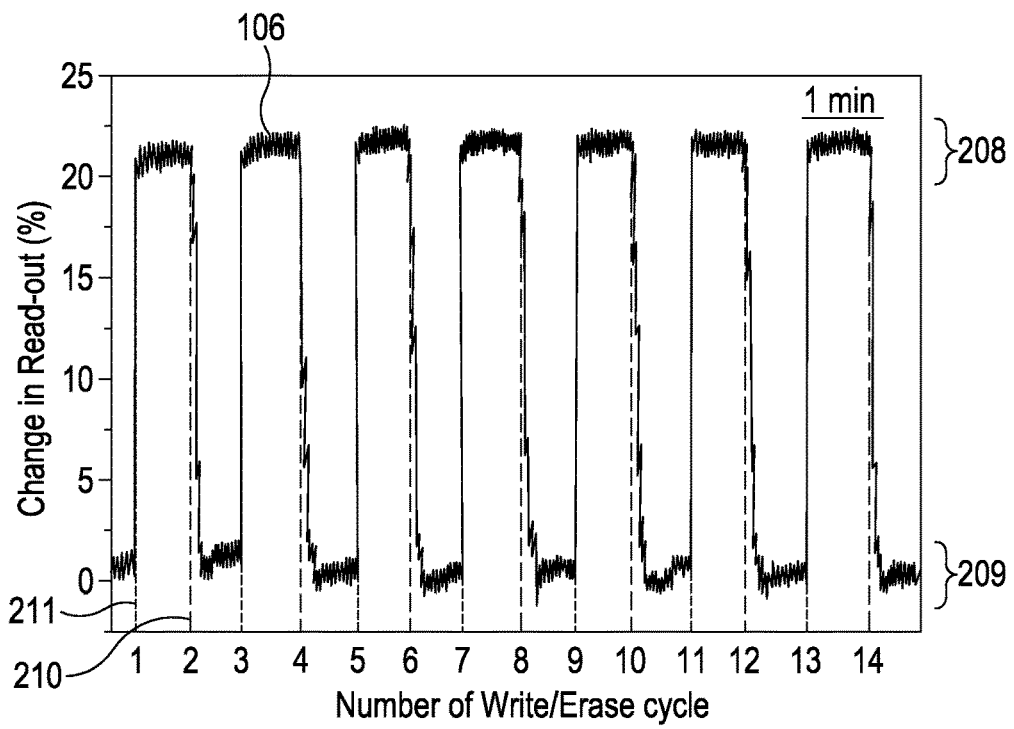
FIG. 6 is a graph showing repeated switching of a transmission characteristic of a waveguide in accordance with an embodiment.

FIG. 6 shows the change in the detected output signal 106 (which indicates a transmission characteristic of the waveguide 101) for an embodiment upon repeated switching between the crystalline (low transmission) state 209 and amorphous (high transmission) state 210 of the PCM. Each transition 211, 210 results in a change in the state of the modulating element 102 (which may be referred to as "switching"), resulting in a clear change in the output signal 106 between a high level 208 (corresponding with a more amorphous state) and a low level 209 (corresponding with a fully crystalline state). The results demonstrate unequivocal binary data storage in an embodiment, with good reversibility and high transmission contrast (around 20% in this example). Switching over 14 cycles is shown in FIG. 6. The write transition 211 was initiated by a single 100 ns pulse, while the erase transition used a sequence of six consecutive 100 ns with decreasing power. The time between each transition 210, 211 was one minute.

Figure 7:
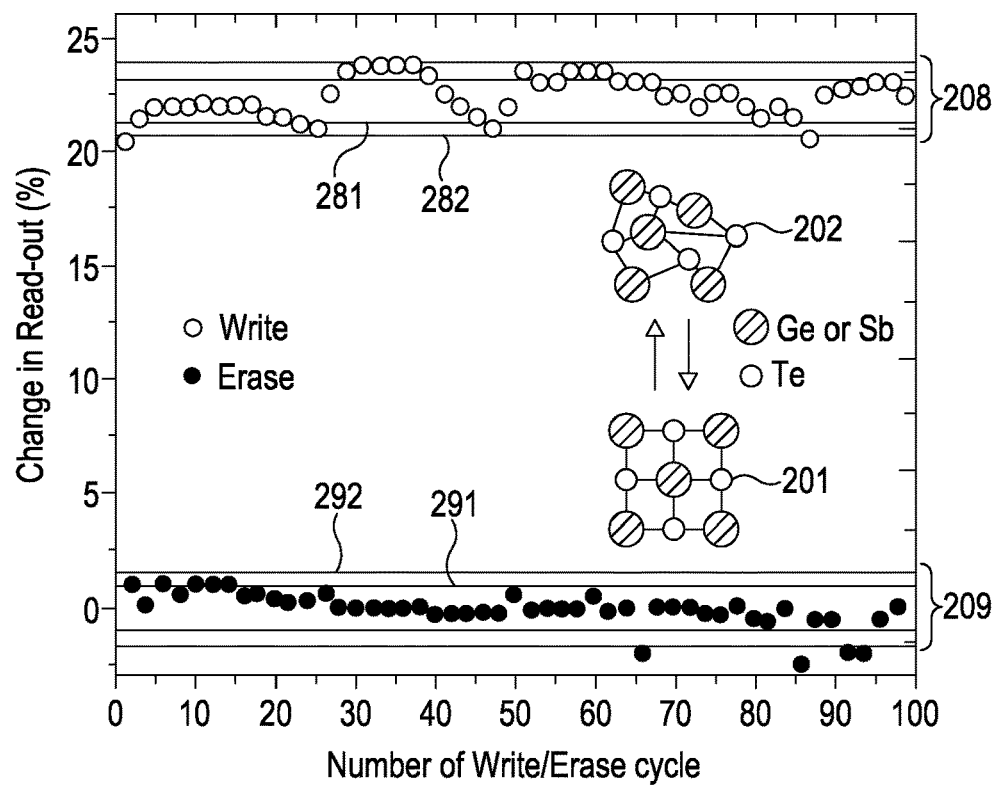
FIG. 7 is a graph showing the repeatability of the switching according to an embodiment over an increased number of cycles.

FIG. 7 illustrates that the switching of the modulating element 102 is highly reproducible over fifty cycles with a measured confidence interval of ±7.1%. The first standard deviation 281, 291 for the amorphous state 208 and crystalline state 209 are shown, along with the respective second standard deviations 282, 292.

The low-transmission state 209 is initially prepared from the fully crystallized phase in such a way that reversibility of the operation is ensured (as discussed above). On the other hand, the absolute transmission at the high level 208 is determined by the employed switching energy, which defines the final level of amorphization, and the GST dimension along the waveguide 101, which defines the modulation depth.

To ensure high transmission contrast in the results of FIGS. 6 and 7 a GST cell of 5 μm length was used. A change in read-out transmission of 21% was observed using a single 100 ns write pulse of 533 pJ energy. Since the GST cell 102 absorbs nearly 80.7% of the pulse in the crystalline state (derived from a measured optical attenuation of −7.14 dB past the device), this corresponds to a switching energy of 430 pJ. Further demonstrations of binary operation were realized by employing devices with smaller GST lengths and lower write pulse energy, as described in the supplementary material. In particular, modulation depth up to 58.2% and binary operation with pulses as short as 10 ns with switching energies of 13.4 pJ have been achieved. While the data in FIGS. 6 and 7 demonstrates the nonvolatility of states encoded in a modulating element 102 comprising a PCM for several minutes, in other embodiments it has been confirmed that the phase-state may be preserved over a much longer times, up to a period of at least three months. Indeed, extrapolating from the well-studied data retention properties of GST an optical memory according to an embodiment can be expected to remain non-volatile on a timescale of years.

Figure 8:
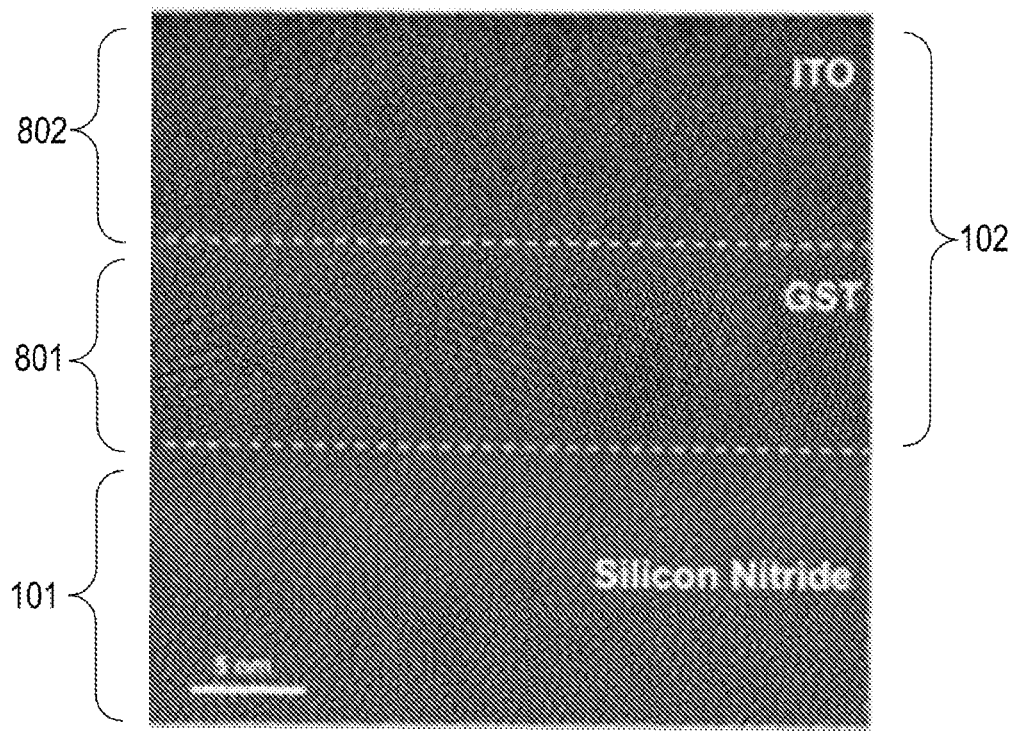
FIG. 8 is a transmission electron micrograph of a cross section through a device according to an embodiment, where the modulating element is in a crystalline state.
Figure 9:
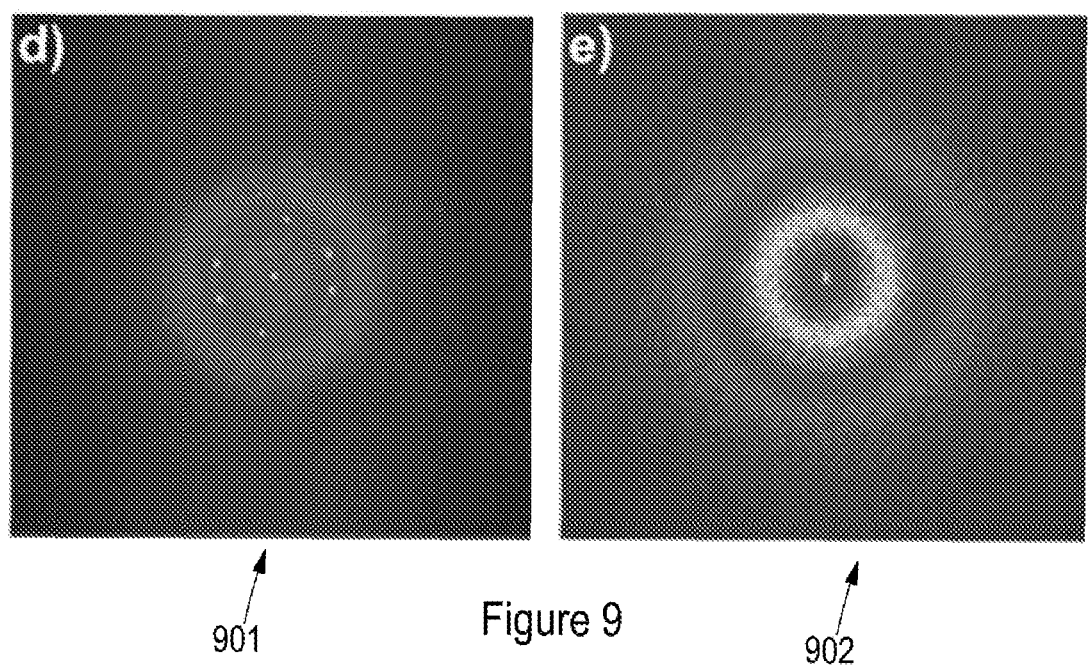
FIG. 9 shows a Fourier analysis of the TEM data of FIG. 8 with the device in a crystalline state, and a Fourier analysis of a TEM taken of a similar device with the modulating element in an amorphous state.

FIG. 8 shows a transmission electro micrograph of a section through a device 100. The TEM specimens were prepared by focused ion beam (FIB). The cross sectional lamellae were cut from a device according to an embodiment along the waveguide and thinned to a thickness of less than 50 nm for TEM imaging. The silicon nitride waveguide 101 is visible, and the deposited GST layer 801 and the ITO layer 802 can also be seen. The ordered lattice structure of GST in the crystalline state is visible. Fourier analysis of the TEM image of FIG. 8 produces a diffractogram with clear features corresponding to the ordered lattice structure of cubic GST. FIG. 9 shows a Fourier analysis of similar data from a PCM material of device that has been optically switched into an amorphous state showing the pronounced halo expected for the amorphous phase.

Besides repeatability, speed may be an important factor for applications in which a device 100 is used as a memory element. In this context, the speed at which read, write and erase operations can be achieved in a device is important. In devices according to an embodiment, read-out may rely on photon absorption, with information encoded in the amount of signal (e.g. signal power) transmitted through the waveguide 101. The read-out can therefore be performed on picosecond time scales and is not a bottleneck in achieving high speed operation.

On the other hand, write operations 211 and erase operations 210 are linked both to amorphization and crystallization times which are intrinsic properties of the modulating element 102. In prior art GST cells, amorphization times in the picosecond range are reported, and crystallisation times in the nanosecond to sub-nanosecond and nanosecond.

In the case of a memory cell comprising a device according to an embodiment, the writing speed (amorphization) may be considered to be the more stringent requirement since it determines how quickly information can be stored. As outlined above, in the initial prototype devices it has been shown that write operations are possible with pulses as short as 10 ns. To determine how fast a device 100 according to an embodiment might be operated, the phase-transition of the modulating element 102 was monitored by performing time-resolved measurements during optical switching.

The observed transient behaviour of a device 100 according to an embodiment showed that, besides the length of the write pulse, the speed of the device 100 is also limited by the post-excitation relaxation time (which may be termed dead time). For 700 ps write pulses, an operation speed of 800 MHz was obtained (taking pulse length and dead time into account). Writing speeds of a few GHz can be expected using picosecond instead of nanosecond pulses to switch the state of the modulating element 102.

Figure 10:
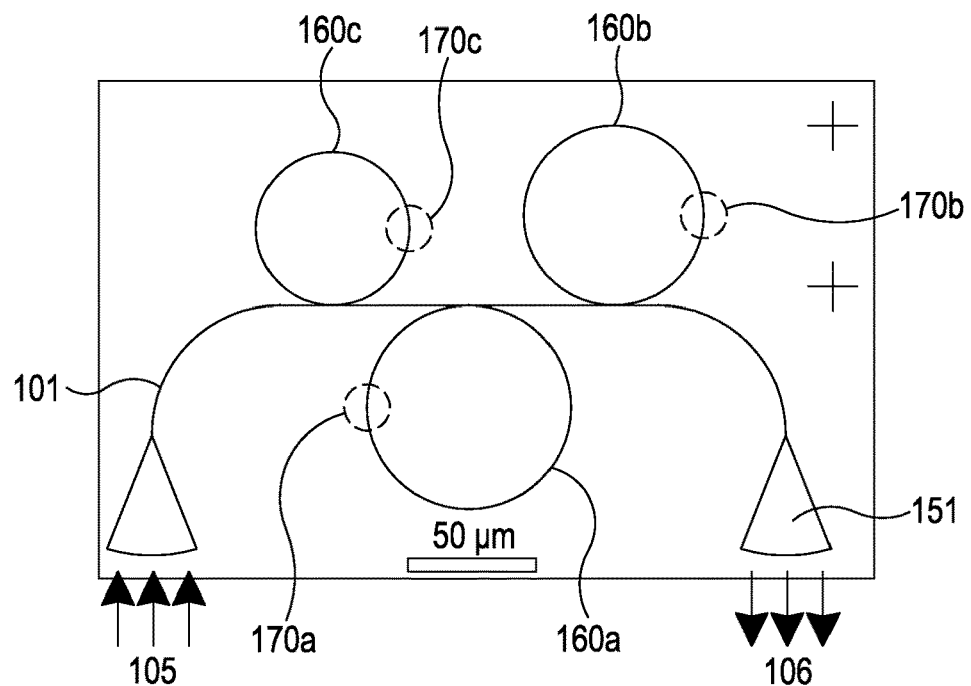
FIG. 10 is a scanning electron micrograph of a device according to an embodiment, comprising a first, second and third ring resonator, and a first, second and third modulating element coupled respectively coupled to each of the resonators.

FIG. 10 shows a device comprising a waveguide 101, the waveguide 101 comprising a first, second and third ring resonator 160a-c. Each of the ring resonators 160a-c has a different diameter, and is thereby tuned to a different resonant frequency and corresponding wavelength. A grating coupler 151 is provided at a first and second port of the waveguide 101, for coupling from free space into the waveguide 101. Each of the ring resonators 160a-c comprises a modulating element 102, the location of which is indicated by the dotted circles 170a-c. Since each of the ring resonators 160a-c admits only a specific wavelength of light (due to cavity internal interference preventing off-resonance wavelengths from entering a ring), only light with a wavelength close to resonance can be used to switch or read-out the respective memory cell.

Each of the modulating elements is therefore individually addressable, and the spectral transmission properties of the waveguide 101 is adjusted by switching the state of each modulating element. In this embodiment, there may be a plurality of probe signals 105 at different wavelengths, each probe signal 105 having a wavelength tuned to address a specific modulating element 102 (which may encode data). In this way the state of a plurality of modulating elements 102 may be determined simultaneously, using a wavelength division multiplexed (WDM) signal.

This type of embodiment may be used to implement a single memory element or cell that can store a plurality of bits of data, which can subsequently be read in parallel. The simplicity of devices according to an embodiment make them fully compatible to on-chip nanophotonic circuitry, allowing for easy integration and exploitation of a wide range of commonly used optical signal processing techniques such as WDM. The embodiment of FIG. 10 illustrates a wavelength-multiplexed integrated multi-bit architecture that is suitable for ultra-fast read-out with up to 10 dB modulation depth.

This approach uses the wavelength-filtering property of the on-chip optical cavities (in this example, ring resonators) which enables wavelength selective addressing of individual modulating elements 102.

Figure 11:
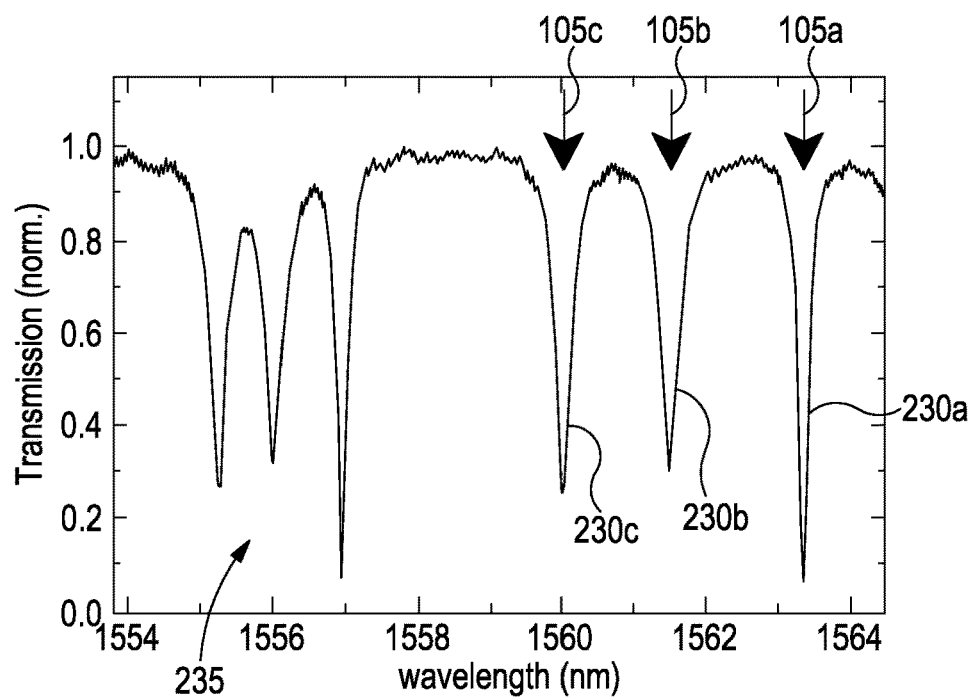
FIG. 11 is a graph of a transmission characteristic of the device of FIG. 10 with respect to wavelength.

FIG. 11 shows a spectral transmission characteristic of the waveguide of FIG. 10, in which the distinct resonances 230a-c, respectively corresponding with resonators 160a-c, are clearly visible (along with further such resonances 235). The switching signal for the first, second and third modulating elements (of the first 160a, second 160b and third 160c resonators) comprise laser pulses at 1563.35 nm, 1561.5 nm and 1560.1 nm respectively. While a write transition is carried out with a single 10 ns pulse, repeatability is again ensured by performing an erase transition with a train of consecutive 50 ns pulses of decreasing energy (at the appropriate wavelength).

Figure 12:
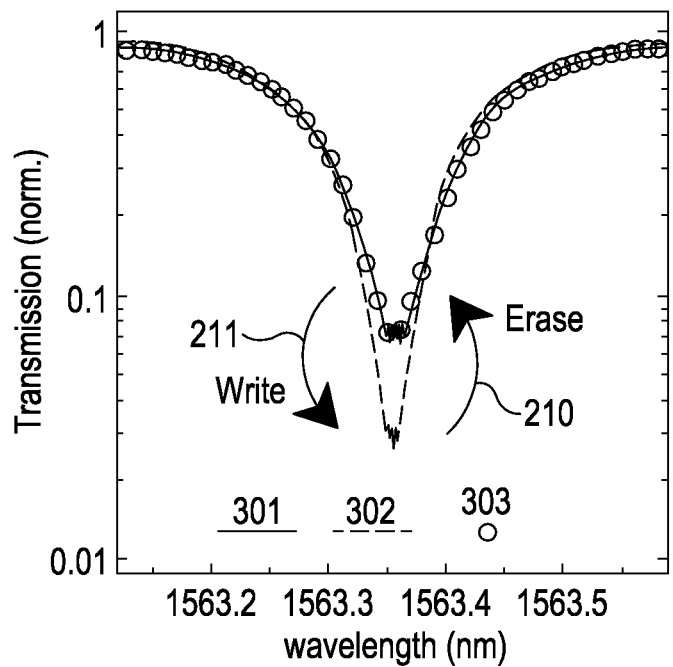
FIG. 12 is a graph showing switching of a transmission characteristic of the device of FIG. 11 at a first wavelength corresponding with the first ring resonator.
Figure 13:
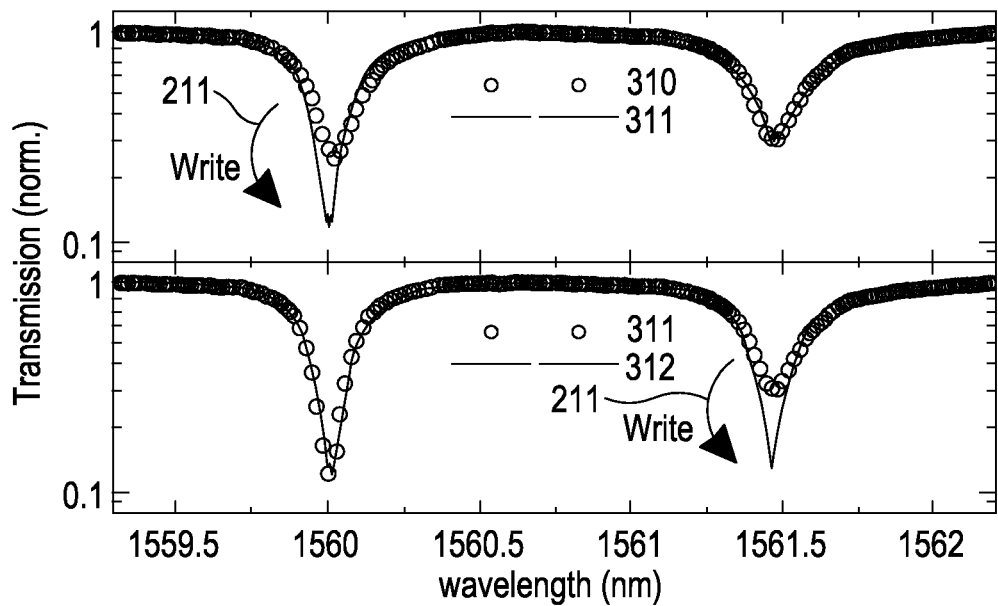
FIG. 13 is a graph showing independent switching of the transmission characteristic at a second and third wavelength (respectively corresponding with the second and third resonators)

In FIGS. 12 and 13 the individual changes of the three resonances upon switching, resulting from the modified refractive index of the GST element, are shown. FIG. 12 shows a spectral response corresponding with the first resonance, showing a spectra 301 before a writing operation 211, a spectra 302 after a writing operation 211, and a spectra 303 after an erase operation 210 (returning the PCM to a crystalline state). It can be seen that the initial state is recovered after one write/erase cycle, since the spectra 301 and 303 are substantially identical.

FIG. 13 illustrates that each modulating element can be addressed individually. Spectra for both the second and third resonance are shown:
- 310; before a write operation (in the crystalline state);
- 311; after a write operation 211 is performed to switch the state of the second modulating element; and
- 312; after a further write operation 211 to switch the state of the third modulating element.

Switching signals applied to address a single modulating element clearly do not affect the other modulating elements.

Figure 14:
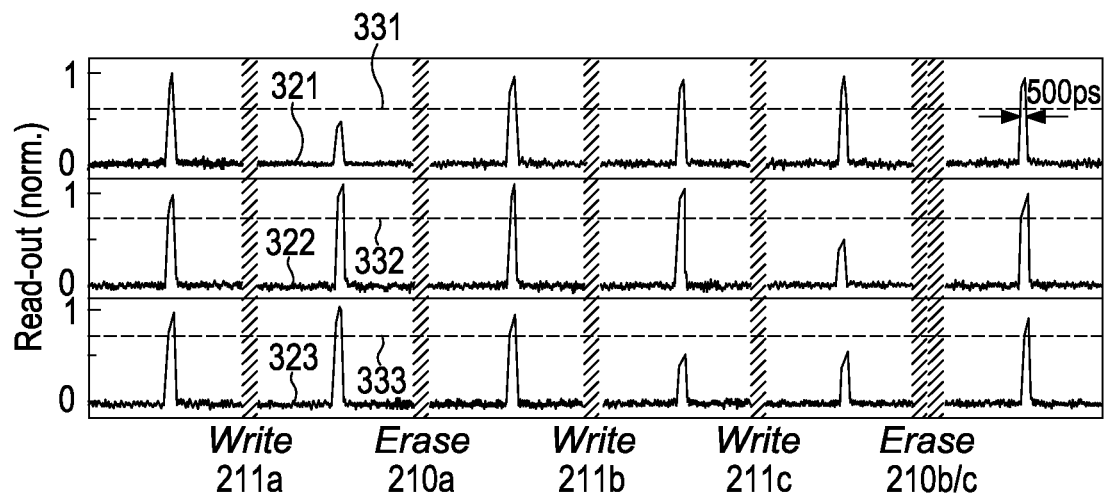
FIG. 14 is set of three graphs showing independent switching of a transmission characteristic of the device of FIG. 10 at each of the first, second and third wavelengths.

FIG. 14 shows that each modulating element can be read-out individually. In this example 500 ps probe pulses 107 were used, with a pulse energy of 0.48±0.03 pJ. Here, probe signals at three distinct wavelengths (1563.3 nm, 1561.45 nm and 1560.0 nm, respectively) are used to probe the transmission characteristics of the waveguide 101, and hence the state of each modulating element (and any data encoded in the state thereof). FIG. 14 shows a time history 321, 322, 323 of a first, second and third probe signal respectively corresponding with each of the first, second and third modulating elements. In order to maximise the readout contrast on switching, probe pulses for each modulating element may be detuned (e.g. red-detuned) from the wavelength of the corresponding switching signal onto the slope of the cavity resonance. While a modulation depth of 3 dB is achieved upon switching each individual memory cell, the read-out level of the non-addressed memory elements does not change. With this approach modulation depths exceeding 10 dB are possible.

In some embodiments a plurality of states of the modulating element 102 are used to encode more than one bit of information in each modulating element 102. This may be combined with wavelength addressable multi element cell architectures, and may further increase the number of bits that can be encoded or stored in a device according to an embodiment.

Embodiments of the invention may be applicable to future high-density data storage, where it may be desirable to reduce the overall dimensions of the device and to use multi-level access (i.e. storing multiple bits per modulating element) in a single cell. The smallest prototype memory element realised thus far has a footprint of 0.25 µm$^2$, but it is expected that smaller cells could be achieved in accordance with recent reports on electrical PCM-based devices.

Figure 15:
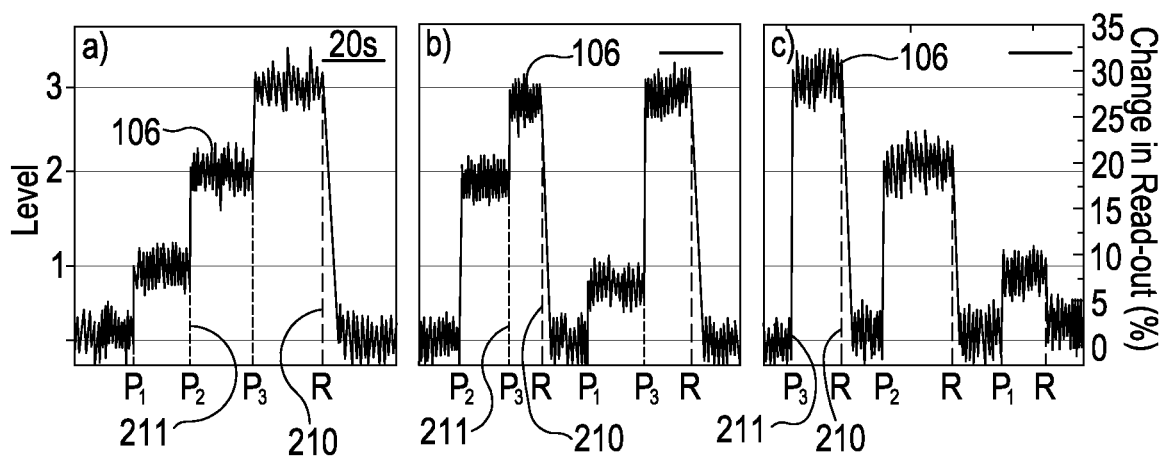
FIG. 15 is a set of graphs showing switching between four clearly distinguishable levels of transmission characteristic for a device according to an embodiment for: a) successively increasing levels; b) arbitrary ascending order of levels; c) arbitrary descending order.

FIG. 15 is a graph illustrating switching between more than two states of a modulating element 102. A detected probe signal 106 is shown with respect to time, and the detected probe signal 106 is switched between four different levels (0, 1, 2, and 3) by writing operations 211 and erase operations 210. At a) the state of the modulating element 102 and hence the detected probe signal 106 is switched from 0, to 1, to 2, to 3, and then directly back to 0. At b) the state of the modulating element 102 and hence the detected probe signal 106 is switched from 0, directly to 2, then to 3, then directly to 0, then to 1, then to 3, and then directly back to 0. At c) the state of the modulating element 102 and hence the detected probe signal 106 is switched from 0, directly to 3, then directly to 0, then to 2 and back directly to 0, the to 1 and back to 0.

The modulating element 102 may not only have a small footprint (smaller than can readily be addressed using free space optics) but may also be capable of encoding multiple levels in an element, using simple but extremely effective write/erase and read techniques. Using optical switching pulses 135 with varying pulse energy it is possible to move freely and reliably between more than two states with high repeatability. This multi-level operation relies on the freely accessible intermediate crystallographic states of the GST, i.e. states with a mixture of crystalline and amorphous regions. These mixed states exhibit optical transmission properties lying between those of the level 1 and level 0 shown in FIG. 3

The data of FIG. 15 was recorded using a 5 µm long PCM element, with each transition between levels being initiated by a single 100 ns light pulse. Four clearly distinguishable levels are reached with switching pulses $P_i$ of level-specific energies in the range 465 to 585 pJ. The energy of pulse $P_1$ was 465±13 pJ, the energy of pulse $P_2$ was 524±14 pJ, and the energy of pulse $P_3$ was 585±14 pJ. In FIG. 15a these levels were reached in a serial manner and subsequently the erase operation R was carried out from level 3. Furthermore, the same bit levels were also shown to be accessible in random order as shown in FIG. 15b. Here the erase operation R (i.e. a return to level 0) was not only possible from the highest transmission state, but from any intermediate level as shown in FIG. 15c.

These results demonstrate that both write and erase operations, to and from any level, are possible with high accuracy allowing a reliable multi-bit memory operation. This is particularly attractive because such arbitrary transitions are very difficult to achieve in electronic memories employing phase change materials, where iterative write-and-erase algorithms involving multiple (typically 3 to 5) write/read (/re-write) cycles are needed to achieve a pre-defined level, adversely affecting the overall write speed and power consumption.

The number of possible levels in a device according to an embodiment is limited by the separation (difference in transmission) between the highest and lowest state and the required confidence interval of an intermediate level. The former can be increased by using either a larger modulating element or higher pulse energies. The confidence interval, on the other hand, is mainly limited by the minor variations in the switching and by the signal-to-noise ratio (SNR) of the read-out measurement. Therefore, the number of memory levels can be increased by just using a higher read-out power ensuring a better SNR (within limits).

Figure 16:
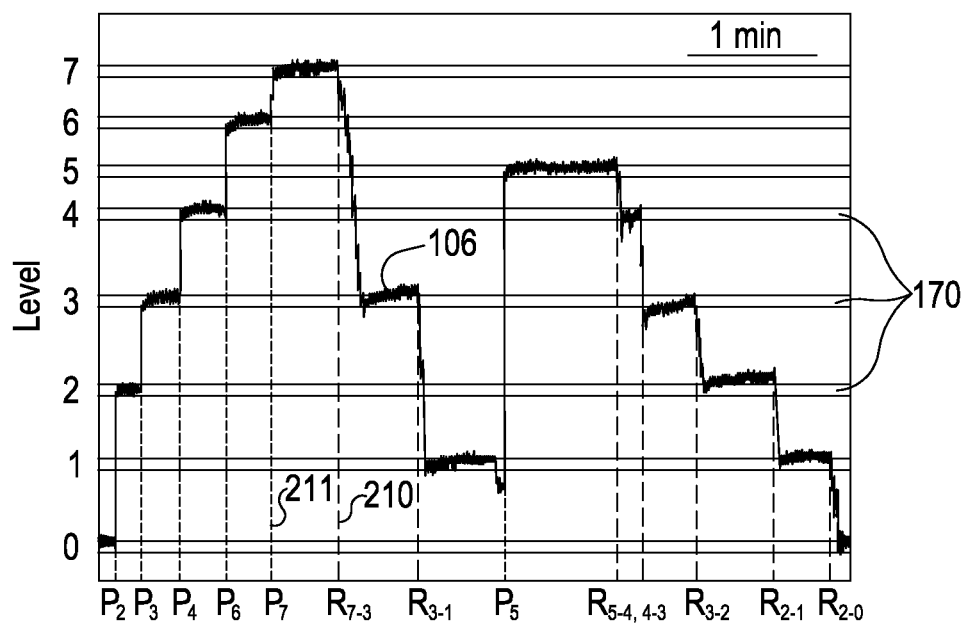
FIG. 16 is a graph showing the transmission characteristics of a device switchable between eight different levels of transmission characteristic.

This is illustrated in FIG. 16, where 8 levels of state discrimination (i.e. 3 bits per cell) are demonstrated within a modulating element 102. Each level corresponds to a partially crystalline state, presenting a specific change in transmission by applying pulses with varying energies as presented in FIG. 17. The individual levels are reached with pulses $P_i$ of level-specific energies in the range 372 to 601 pJ (the energies in pJ being approximately $EP_1$=372, $EP_2$=415, $EP_3$=465, $EP_4$=524, $EP_5$=561, $EP_6$=585, and $EP_7$=601). In FIG. 16 it can also be observed that the difference between the transmissions of any two consecutive levels is much higher than the uncertainty marked by the a band 170 across each level. In FIG. 16 it is also demonstrated that each level can be reached from both directions, i.e. with an amorphization as well as a crystallization step. This implies that any level is accessible from all others, with very accurate control of the transmission levels and remarkable repeatability (as seen by the accurate re-writing of levels 1 to 4 in FIG. 16), just by applying the appropriate write or erase pulse. This provides a significant progression in functionality and may be important for the realization of practicable photonic memories.

Figure 17:
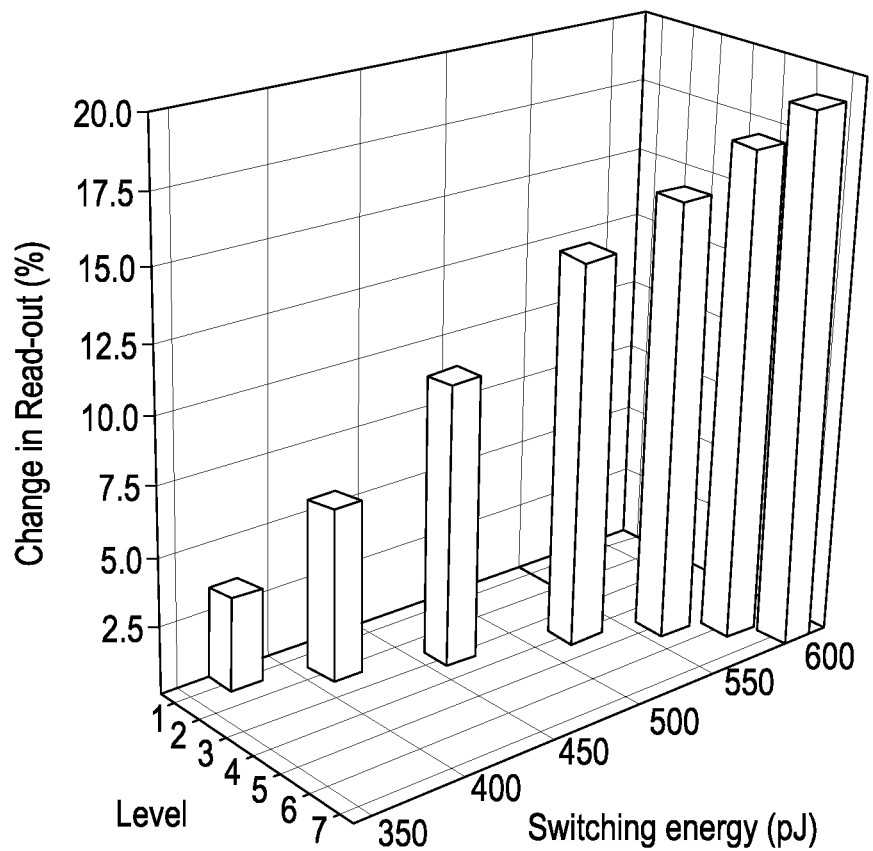
FIG. 17 is a 3D bar chart illustrating the relationship between the energy of the optical switching signal, the addressed level, and the corresponding change in transmission characteristic according to an embodiment.

Another aspect of device performance for data storage applications is energy consumption per bit. In a memory cell comprising a device according to an embodiment both writing and erasing may rely on changes in state of the modulating element material. For the example device comprising a GST modulating element 102, the switching energy is given by the amount of energy that is required to heat the GST above the melting (amorphization) or glass-transition (crystallization) temperature, respectively. Therefore, the energy consumption is directly related to the volume of the memory element and read-out contrast. The relationship between switching energy and read-out contrast is shown in FIG. 17. In binary operation, a read-out contrast of 21% was demonstrated with 430 pJ switching energy. On the other hand, switching energies as low as 13.4 pJ for the same device are possible for a reduced contrast of 0.7% which still enabled clear distinction of the two levels. In addition, it is estimated that energy consumption can be improved by up to one order of magnitude by operating the device with sub-nanosecond instead of tens of nanosecond pulses. A thermo-optical analysis has shown that the portion of absorbed energy that gets lost due to thermal diffusion increases significantly with increasing pulse length. Therefore, shorter and more intense pulses are beneficial in terms of energy requirement by quickly heating up the modulating element 102 to the required transition temperature while reducing thermal diffusion losses.

In this early prototype of a device, energy consumption and speed achieved compares well with pre-existing electrical counterparts. For example, current commercial PCM-based electrical memories (at the 45 nm node) typically require write pulses of 50-100 ns duration and read pulses of 10 ns (considerably longer than the 10 ns/500 ps write/read demonstrated for an embodiment), along with 5-10 pJ write energy (c.f. ~13 pJ for an embodiment). Although research-level electrical PCM devices improve on such performance figures (e.g. 3.4 pJ write energy and 20 ns write pulses), the performance of an embodiment can be further improved by operating them with shorter pulses and by moving to modulating elements with smaller footprint, as well as through the development of new materials with faster and lower temperature switching. Higher signal to noise ratio to improve the read-out contrast could also be obtained with the use of optical cavities, which would also reduce switching energies.

To reduce the device footprint, alternative architectures, such as plasmonic antennas could be explored. Alternatively, scaling down is plausible by using photonic circuitry operating at shorter wavelengths (therefore, narrower waveguides) or by using alternative phase-change materials with a higher difference in refractive index (e.g. in the C and L-band). This way, smaller devices may provide sufficiently good contrast. While multi-bit access has been demonstrated with micro-ring resonators with relatively large footprint, alternative technologies such as ultra-compact on-chip optical multiplexer/demultiplexers can be employed for size reduction. In addition, optical cavities with smaller mode volume such as photonic crystal devices may be used to localize the interaction volume of the optical mode with the memory element further and thus lead to a smaller system size for wavelength selective memory access.

Figure 18:
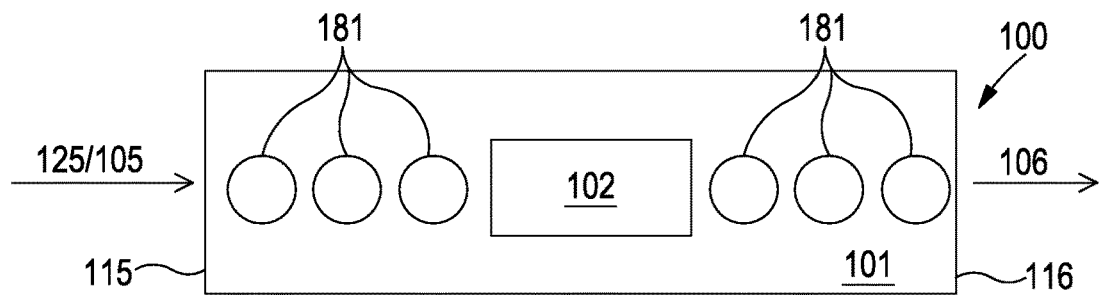
FIG. 18 is a schematic plan view of a device according to an embodiment in which a photonic structure is used in enhance coupling between the waveguide and modulating element.
Figure 19:
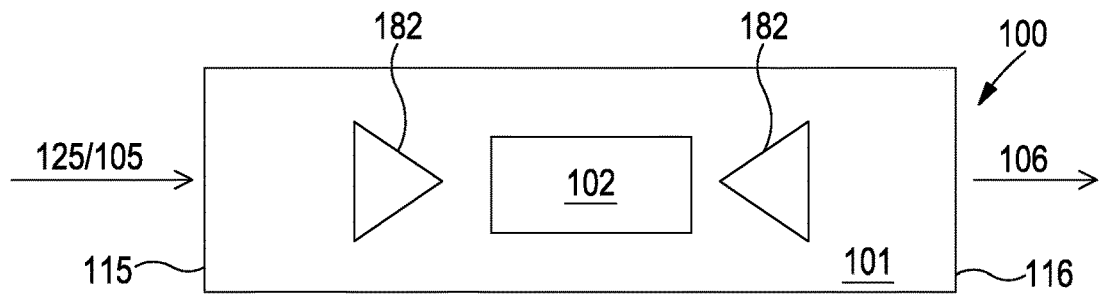
FIG. 19 is a schematic plan view of a device according to an embodiment in which a plasmonic antenna is used in enhance coupling between the waveguide and modulating element.

FIGS. 18 and 19 respectively illustrate examples of a device 100 according to an embodiment, similar to that of FIG. 1, in which photonic crystal structures 181 (FIG. 18) and plasmonic antennas 182 (FIG. 19) are used to enhance interaction with the modulating element 102.

Figure 20:
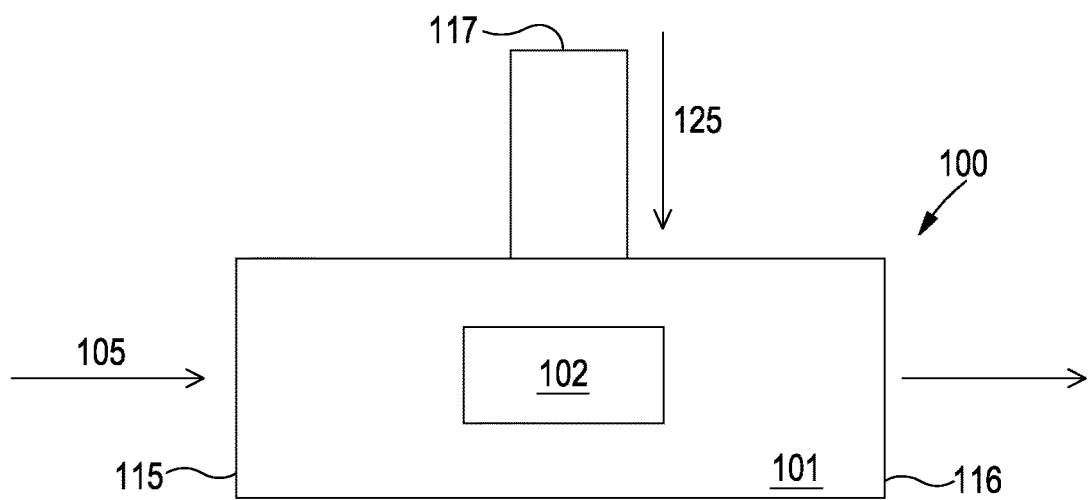
FIG. 20 is a schematic plan view of a device according to an embodiment comprising an input port for receiving a probe signal, an output port for monitoring a transmission characteristic of the waveguide using the probe signal, and a control port for receiving the switching signal.

FIG. 20 illustrates an embodiment in which the waveguide 101 comprises a first port 115 for receiving a probe signal 105, a second port 116 for detecting the output probe signal 106, and a separate control port 117 for receiving the switching signal 125.

Figure 21:
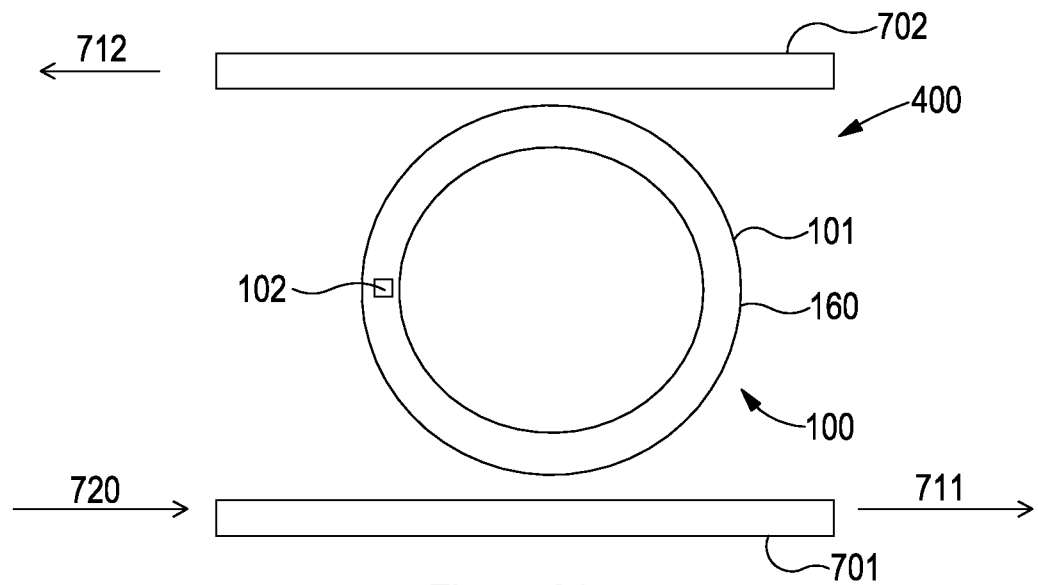
FIG. 21 is a schematic plan view of a device according to an embodiment comprising a first and second waveguide and a coupling waveguide optically coupling the first waveguide to the second waveguide, the degree of coupling depending on the state of the modulating element.

Although examples have been described with reference to memory applications, it will be understood that embodiments are not restricted to memory, and may also be used in optical switching. FIG. 21 illustrates an optical switch 400 according to an embodiment, comprising a first waveguide 701, a second waveguide 702, and a coupling waveguide 101. The coupling waveguide comprises a resonant optical cavity 160 and a modulating element 102 evanescently coupled to the coupling waveguide 101. The state of the modulating element 102 controls a transmission characteristic of the coupling waveguide 101, so as to vary the degree to which light is coupled between the first and second waveguide 720, 721. An input light signal 720 can thereby be switched between output signal 711 and output signal 712. The coupling may be directional, so that light launched in the first waveguide 701 is coupled and launched in a specific direction in the second waveguide 702.

Figure 22:
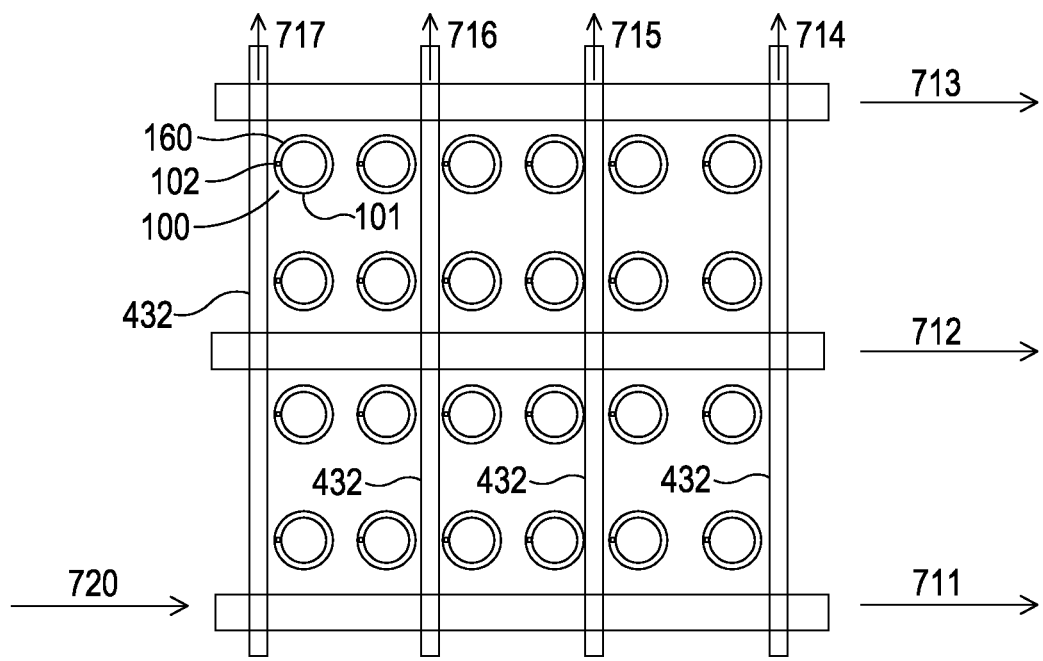
FIG. 22 is a schematic plan view of a switching fabric comprising plurality of horizontal waveguides and a plurality of vertical waveguides, and a device according to an embodiment optically coupling each horizontal waveguide to each vertical waveguide at each respective intersection therebetween.

FIG. 22 illustrates a switching fabric using the same principles as the switch of FIG. 20. A plurality of horizontal waveguides 431 each intersect a plurality of vertical waveguides 432. At each intersection, at least one coupling waveguide 101 is provided, operating on the same principle as described with reference to FIG. 21, controlling the degree to which the intersecting vertical and horizontal waveguides 432, 431 are coupled. Two coupling waveguides may be provided at each intersection, for controlling coupling in each direction at each intersection. The coupling between each intersection need not be via a ring resonator, but may instead by via any optical arrangement comprising a device according to an embodiment (e.g. an optical switch).

Figure 23:
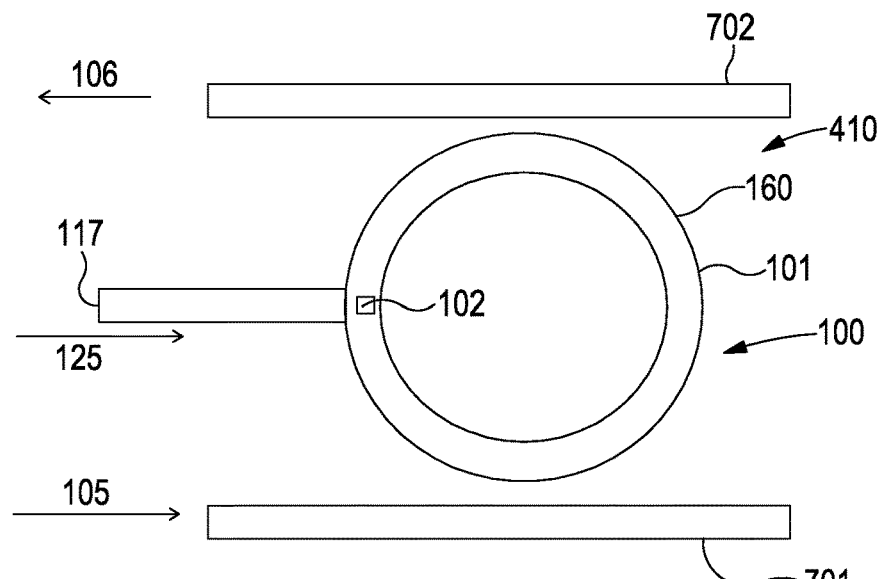
FIG. 23 is a schematic plan view of a photonic latch according to an embodiment.

FIG. 23 illustrates a transistor like latch 410, in which transmission, via a coupling waveguide 101, between a first and second waveguide 701, 702 is controlled based on the state of a modulating element 102 that is evanescently coupled to the coupling waveguide 101. A control port 117 is provided in the coupling waveguide (analogous to a gate contact) for controlling transmission between the first and second waveguides 701, 702.

Figure 24:
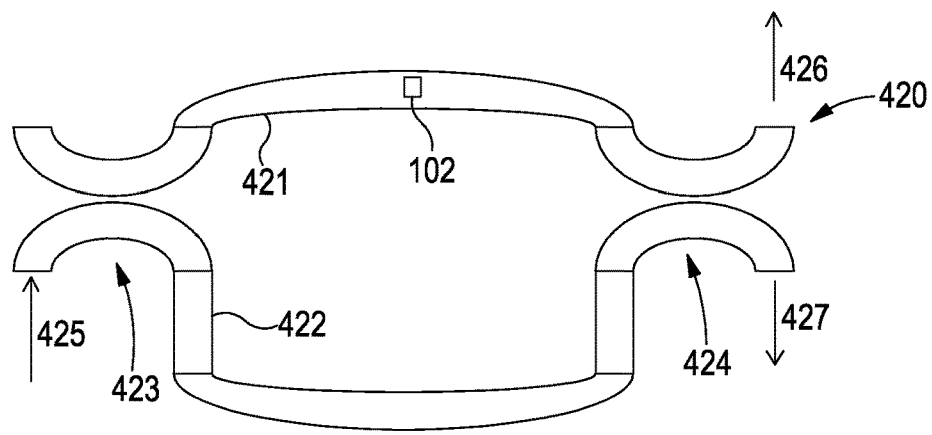
FIG. 24 is a schematic plan view of a Mach-Zehnder interferometer according to an embodiment.

FIG. 24 illustrates a Mach-Zehnder interferometer 420 comprising a device 100 according to an embodiment. The inteferometer receives an input signal 425 at an optical splitter, which divides the input signal 425 between a first path 421 and a second path 422 of the interferometer. Each of the first and second path 421, 422 comprise a waveguide. The first optical path comprises a waveguide 101, the transmission properties of which are varied by the state of a modulating element 102 evanescently coupled to the waveguide 101. In this example, the modulating element 102 may adjust an optical path length of the first optical path 421 (for instance by varying refractive index). Signals of the first and second optical path are recombined at optical combiner 424, so as to produce a first and second output signal 426, 427.

Figure 25:
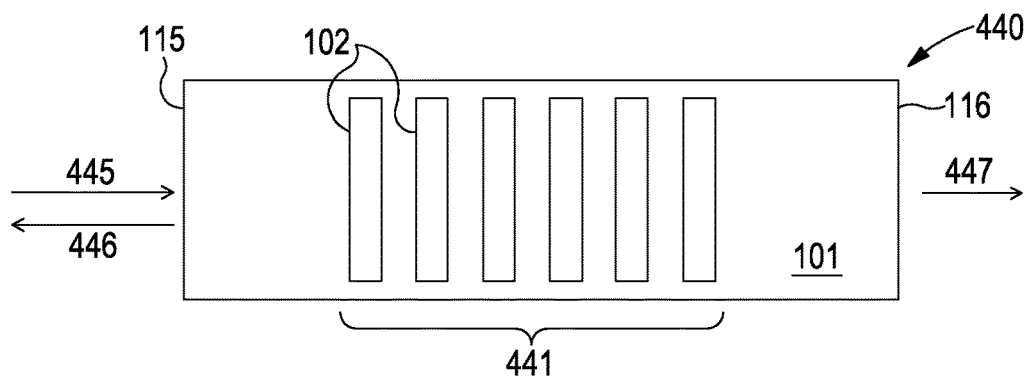
FIG. 25 is a schematic plan view of a tuneable Bragg filter in according to an embodiment.

FIG. 25 illustrates a tuneable optical filter 440 comprising a device 100 according to an embodiment. The filter 440 comprises a waveguide 101, to which is evanescently coupled a plurality of modulating elements 102, so as to define a grating, such as a Bragg grating 441. The transmission characteristics of the grating 441 are varied depending on the state of the modulating elements, so as to vary the transmission and reflection properties of the filter 440, thereby varying the degree to which an input signal 445 is reflected as return signal 446, or transmitted as signal 447.

Figure 26:
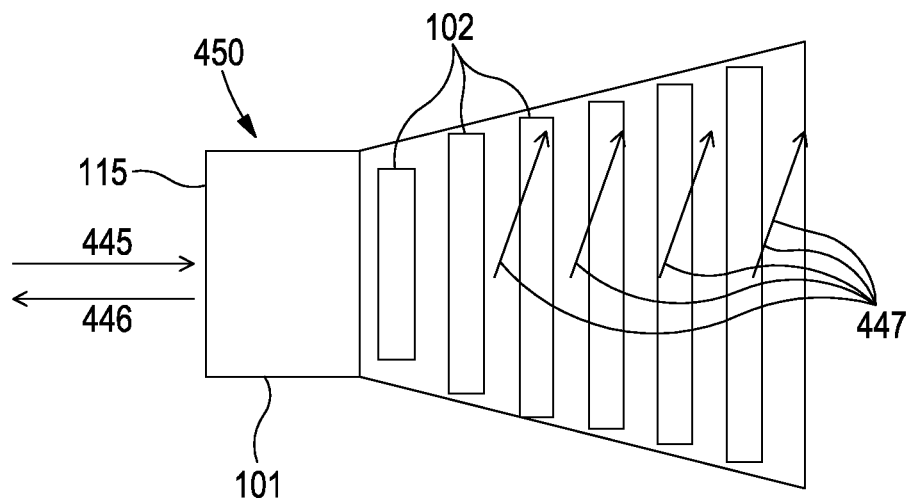
FIG. 26 is a schematic plan view of a tuneable grating coupler according to an embodiment.

FIG. 26 illustrates a grating coupler 450 comprising a device 100 according to an embodiment. The coupler comprises a waveguide 101, to which is evanescently coupled a plurality of modulating elements 102, so as to define a grating. The transmission characteristics of the grating are varied depending on the state of the modulating elements, so as to vary the transmission and reflection properties of the grating coupler 450, thereby varying the degree to which an input signal 445 is reflected as return signal 446, or transmitted as signal 447.

FIG. 27 illustrates a device 100 according to an embodiment in which the state of the modulating element 102 may be altered by an electrical signal. The device 100 comprises an optical waveguide 101, with a modulating element 102 evanescently coupled to the waveguide 101. The state of the modulating element 102 modifies the transmission, reflection or absorption characteristics of the waveguide 101, depending on its state. A resistor 123 is provided in thermal contact with (e.g. on top of, or adjacent to) the modulating element 102. When an electrical current is passed through the resistor 123, it will heat up the modulating element 102, which results in the modulating element 102 changing state (as previously described). As previously described, an optical probe signal may be used to determine the state of the modulating element 102.

The resistor 123 may comprise part of a conducting track, for example a metal or semiconductor track. In some embodiments the resistor 123 may comprise a material that is substantially transparent at the optical probe signal wavelength. The resistor 123 may, for example comprise a resistor track patterned over the modulating element. A dielectric layer or insulating layer may be interposed between the resistor 123 and the modulating element 102.

FIG. 28 illustrates an embodiment in which the state of the modulating element 102 can be read and/or written electrically (i.e. by an electrical signal). The state of the modulating element 102 may further be read and/or written optically, by optical signals carried by the waveguide 101 (as described above). The device 100 comprises a waveguide 101, modulating element 102, first electrode 121 and second electrode 122.

The first electrode 121 and second electrode 122 are both in electrical contact with the modulating element 102, so that a voltage difference applied between the first and second electrodes 121, 122 results in a current through the modulating element 102. Where the modulating element 102 comprises a layer of material, it may be convenient for the first electrode 121 to be disposed under the layer, and the second electrode 122 to be disposed on top of the layer.

Alternatively, a lateral arrangement of electrodes may be used, in which the flow of current through the layer of the modulating element 102 is substantially in the plane of the layer.

The resistance of the modulating element 102 may be inferred from its voltage-current characteristics via the first and second electrodes 121, 122. The state of the modulating element 102 may thereby be inferred from an electrical probe signal applied to via the first and second electrodes 121, 122. Furthermore, the state of the modulating element 102 can be varied by Joule heating the modulating element 102 by applying a voltage difference between the first and second electrodes 121, 122.

At least one of the first and second electrodes 121, 122 may comprise an optically transparent material, such as ITO. The optical reading and/or writing of the modulating element 102 may be substantially as described above, with reference to other embodiments.

Features of the example embodiments described with reference to FIGS. 27 and 28 may be combined. For example, an arrangement that includes both a resistor 123, enabling heating of the modulating element 102 by thermal conduction (without passing current through the modulating element 102) may be combined with first and second electrodes 121, 122. Such a device may be electrically written via the resistor and/or first and second electrodes 121, 122. Furthermore, the device may be read and/or written optically, by optical signals in the waveguide 101.

The stacked arrangement of layers depicted in the drawings is merely schematic, and each layer may be partially embedded within another layer (e.g. by an patterning and planarization process), or may be conformal over the topography of other layers. For example, the upper surface of the lower electrode in FIG. 28 may be coplanar with the upper surface of the waveguide core. Other variations are possible.

Electrical reading and/or writing may be more straightforward to interface with an electrical controller. Optical reading and/or writing may offer faster speed. Depending on the application, different combinations of electrical and optical reading and writing may be appropriate.

A device has been described that is suitable for use as an integrated, all-photonic, truly-nonvolatile memory that provides multi-level (e.g. 8 level) storage in a single cell along with multi-bit (e.g. 3 bit) wavelength division multiplexed access (via a single waveguide). A low-dimensional (i.e. small) modulating element (e.g. phase-change elements) may be integrated with a suitable waveguide. The modulating elements are switched between states by evanescent coupling to light travelling along the waveguides and are thus not restricted in size by the diffraction limit. Furthermore, the ability to switch readily and directly between more than two levels has been shown, with accurate control of the readout signal and excellent repeatability (capabilities that requires complex iteration based algorithms in electronic phase change memories). The capability for fast (~500 ps), low power (~480 fJ), single shot readout of the modulator element state has been shown, along with repeated (×100) write/erase cycling while maintaining high readout contrast. Embodiments of the invention are fully scalable: large arrays of all-optical memory elements can be realised in accordance with embodiments which are conveniently addressed, using WDM techniques, through on-chip waveguides; such attributes are applicable for the realization of practical on-chip optical interconnects. Embodiments of the present invention may be used for storage class memory.

Hybrid circuits exploiting modulating elements (which may comprise PCMs) may be enabled in accordance with embodiments, leading to new forms of non-conventional (non-von Neumann) computation and processing.

Embodiments of the present invention may be suitable for use in a neuromorphic or synaptic-based processor. For example, the accumulation of phase change in the modulating element may be exploited to operate a device as an accumulator or adder, which is a basis computational element. A phase change switching element can be configured to exhibit spike-timing dependant plasticity, which relies on relative spike timings from either side of the synapse. The gradual programming of state of a PCM modulating element using optical (or electrical) signals may be used to emulate a synaptic connection.

It will be appreciated that the vast majority of applications embodiments may comprise all optical reading and writing, but some embodiments may comprise an optical/electrical interface, so that electrical signals are provided to the device for reading and/or writing.

From reading the present disclosure, other variations and modifications will be apparent to the skilled person. Such variations and modifications may involve equivalent and other features which are already known in the art of photonic devices, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom. For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A photonic device comprising: an optical waveguide, and a modulating element that is evanescently coupled to the waveguide; wherein the modulating element modifies a transmission, reflection or absorption characteristic of the waveguide dependant on its state, and the photonic device comprises an electrical conductor configured to switch the state of the modulating element using an electrical signal that heats the modulating element;

wherein the electrical conductor comprises a resistor in thermal contact with the modulating element, so that the modulating element is switchable by passing the electrical signal through the resistor, and heating the modulating element primarily by conduction.

2. An optical system, comprising:
the photonic device of claim 1,
a light source coupled to the waveguide for providing the switching signal; and
a controller operable to modify the transmission, reflection or absorption characteristic of the waveguide by operating the light source to produce the switching signal.

3. The photonic device of claim 1, wherein the modulating element comprises a phase change material such as a phase change superlattice material.

4. The photonic device of claim 1, wherein the modulating element comprises a plurality of stable solid states, each corresponding with a different transmission, reflection or absorption characteristic of the waveguide.

5. The photonic device of claim 1, wherein the modulating element comprises a material comprising a compound or alloy of a combination of elements selected from the following list of combinations: GeSbTe, GeSbSeTe, VOx, NbOx, GeTe, GeSb, GaSb, AgInSbTe, InSb, InSbTe, InSe, SbTe, TeGeSbS, AgSbSe, SbSe, SbS, GeSbMnSn, AgSbTe, AuSbTe, and AlSb.

6. The photonic device of claim 1, wherein a core material of the waveguide has an optical bandgap of at least 1 eV.

7. The photonic device of claim 1, wherein the modulating material has a thickness of less than 100 nm.

8. The photonic device of claim 1, wherein the waveguide comprises an optical resonator, the modulating element being evanescently coupled to the optical resonator.

9. The photonic device of claim 8, wherein the waveguide comprises a plurality of optical resonators or cavities, each having a different resonant frequency, the photonic device comprising a modulating element evanescently coupled to each optical resonator, wherein the transmission, reflection or absorption properties of the waveguide at each of a plurality of wavelengths is independently modified depending on the state of the respective modulating element coupled to the resonator corresponding with the respective wavelength, the state of each modulating element being switchable by an optical switching signal carried by the waveguide.

10. The photonic device of claim 1, wherein the waveguide is a coupling waveguide, and further comprising a first and second waveguide, the coupling waveguide optically coupling the first waveguide to the second waveguide, the degree of coupling depending on the state of the modulating element.

11. The photonic device of claim 10, wherein the optical resonator comprises a ring resonator.

12. A Mach-Zehnder interferometer that splits an input signal received at an input port between a first and second optical path, and then recombines the input signal after it has passed through the first and second optical path, wherein at least one of the first and second path comprise the photonic device according to claim 1 and the transmission, reflection or absorption property is an optical path length.

13. A tunable grating comprising the photonic device according to claim 1, wherein the grating is defined by a plurality of modulating elements disposed side-by-side on the waveguide.

14. An optical filter comprising the photonic device according to claim 1.

15. An optical switch comprising the photonic device according to claim 1.

16. A switching fabric comprising: a plurality of horizontal waveguides, and a plurality of vertical waveguides, and the photonic device according to claim 1 optically coupling each horizontal waveguide to each vertical waveguide at each respective intersection therebetween.

17. A method of varying the transmission, reflection or absorption properties of a device comprising an optical waveguide, comprising changing a state of a modulating element that is evanescently coupled to the waveguide using an electrical conductor configured to switch the state of the modulating element using an electrical signal that heats the modulating element, wherein the electrical conductor comprises a resistor in thermal contact with the modulating element, so that the modulating element is switchable by passing the electrical signal through the resistor and heating the modulating element primarily by conduction.

18. The method of claim 17, wherein the modulating element comprises a phase change material, and changing the state of the modulating element comprises changing the degree to which the phase change material is amorphous or crystalline.

* * * * *